(12) United States Patent
Marukame et al.

(10) Patent No.: US 10,078,550 B2
(45) Date of Patent: Sep. 18, 2018

(54) MEMORY SYSTEM, ERROR CORRECTION DEVICE, AND ERROR CORRECTION METHOD

(71) Applicant: Kabushiki Kaisha Toshiba, Minato-ku, Tokyo (JP)

(72) Inventors: Takao Marukame, Tokyo (JP); Yoshifumi Nishi, Kanagawa (JP); Yusuke Higashi, Kanagawa (JP); Jiezhi Chen, Kanagawa (JP); Kazuya Matsuzawa, Kanagawa (JP); Yuichiro Mitani, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 97 days.

(21) Appl. No.: 14/842,356

(22) Filed: Sep. 1, 2015

(65) Prior Publication Data

US 2016/0085627 A1  Mar. 24, 2016

(30) Foreign Application Priority Data

Sep. 19, 2014  (JP) .................. 2014-191615

(51) Int. Cl.
*G06F 11/10* (2006.01)
*G06F 13/00* (2006.01)
(Continued)

(52) U.S. Cl.
CPC ..... *G06F 11/1076* (2013.01); *H03M 13/2906* (2013.01); *H03M 13/353* (2013.01);
(Continued)

(58) Field of Classification Search
CPC .. G06F 11/1012; G06F 11/10; G06F 11/1076; H03M 13/2957; H03M 13/2906
See application file for complete search history.

(56) References Cited

U.S. PATENT DOCUMENTS

| | | | | | |
|---|---|---|---|---|---|
| 5,077,677 A | * | 12/1991 | Murphy | ................. | G06F 7/00 706/52 |
| 8,453,034 B2 | * | 5/2013 | Sakaue | ............... | G06F 11/1048 714/758 |

(Continued)

FOREIGN PATENT DOCUMENTS

| | | |
|---|---|---|
| JP | 2001-134522 | 5/2001 |
| JP | 2002-304325 | 10/2002 |

(Continued)

OTHER PUBLICATIONS

Tanakamaru et al., "United Solid-State-Storage Architecture with NAND Flash Memory and ReRAM that Tolerates 32x Higher BER for Big-Data Applications," 2013 IEEE International Solid-State Circuits Conference (2013), pp. 226-228.

*Primary Examiner* — Phung M Chung
(74) *Attorney, Agent, or Firm* — Finnegan, Henderson, Farabow, Garrett & Dunner, L.L.P.

(57) ABSTRACT

According to an embodiment, a memory system includes a memory and a computation unit. Into the memory, data are written. The memory stores therein multiple check matrices. Each of the check matrices is associated with the number of errors in the written data. The computation unit is configured to perform a first error correction on the written data by selectively using, from among the check matrices, a check matrix associated with the number of errors recognized in the written data.

9 Claims, 21 Drawing Sheets

(51) Int. Cl.
*G06F 11/08* (2006.01)
*H03M 13/11* (2006.01)
*H03M 13/37* (2006.01)
*H03M 13/29* (2006.01)
*H03M 13/35* (2006.01)
*H03M 13/00* (2006.01)
*H03M 13/15* (2006.01)

(52) U.S. Cl.
CPC .... *H03M 13/6516* (2013.01); *H03M 13/1102* (2013.01); *H03M 13/152* (2013.01)

(56) References Cited

U.S. PATENT DOCUMENTS

| | | | | |
|---|---|---|---|---|
| 8,510,628 | B2* | 8/2013 | Bedeschi | G06F 11/1048 714/746 |
| 9,092,350 | B1* | 7/2015 | Jeon | G06F 11/004 |
| 9,189,322 | B2* | 11/2015 | Sakaue | G06F 11/1012 |
| 9,348,697 | B2* | 5/2016 | Hoya | G06F 11/10 |
| 9,385,754 | B2* | 7/2016 | Sakai | H03M 13/1117 |
| 9,417,956 | B2* | 8/2016 | Sakai | G06F 11/1012 |
| 2008/0055990 | A1 | 3/2008 | Ishikawa et al. | |
| 2008/0133999 | A1 | 6/2008 | Kondo et al. | |
| 2011/0066923 | A1 | 3/2011 | Koshiyama et al. | |
| 2011/0225350 | A1 | 9/2011 | Burger, Jr. et al. | |
| 2011/0276857 | A1* | 11/2011 | Kim | G06F 11/1048 714/763 |
| 2012/0110259 | A1 | 5/2012 | Mills et al. | |
| 2012/0192035 | A1 | 7/2012 | Nakanishi | |
| 2012/0239868 | A1 | 9/2012 | Ryan et al. | |
| 2013/0145231 | A1* | 6/2013 | Frayer | H03M 13/13 714/763 |
| 2013/0232390 | A1 | 9/2013 | Zhang et al. | |
| 2013/0254628 | A1 | 9/2013 | Kim et al. | |
| 2014/0136915 | A1* | 5/2014 | Hyde | G06F 11/0703 714/747 |

FOREIGN PATENT DOCUMENTS

| | | |
|---|---|---|
| JP | 2004-110376 | 4/2004 |
| JP | 2008-59679 | 3/2008 |
| JP | 2008-141439 | 6/2008 |
| JP | 2011-72020 | 4/2011 |
| JP | 2011-81776 | 4/2011 |
| JP | 2012-504842 | 2/2012 |
| JP | 2012-155430 | 8/2012 |
| JP | 2014-500542 | 1/2014 |

* cited by examiner

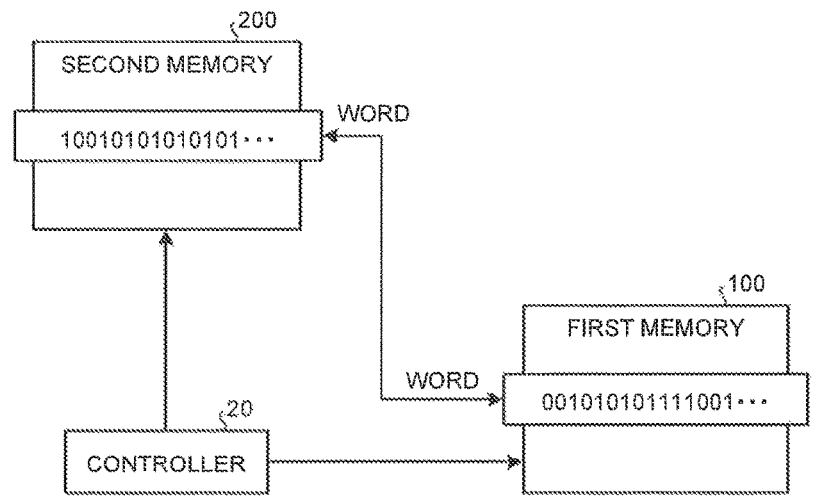
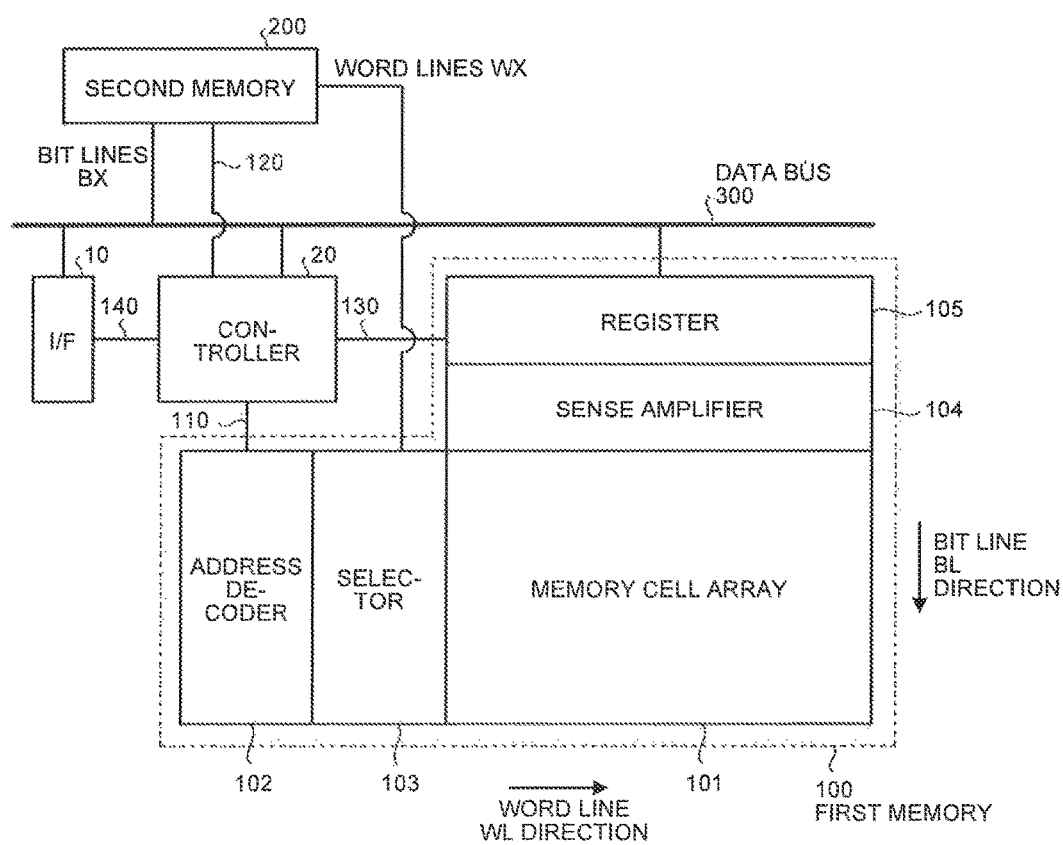

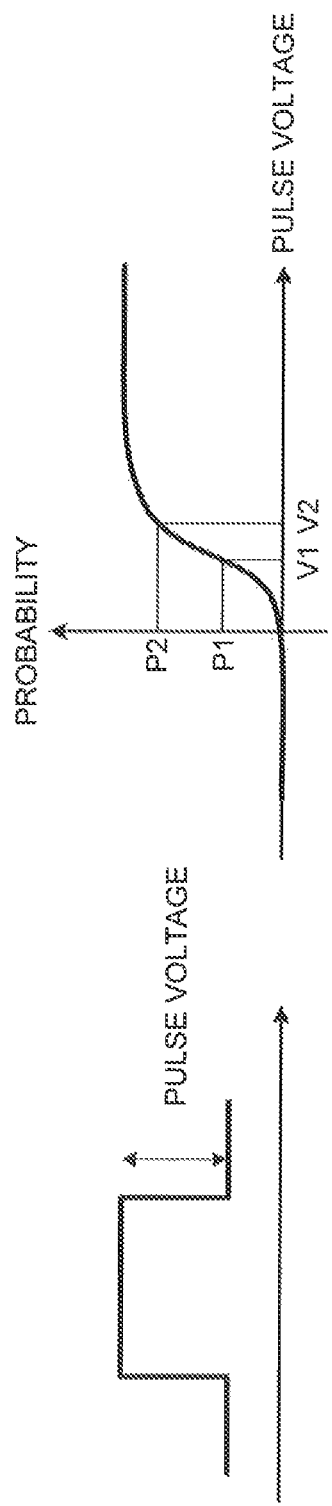

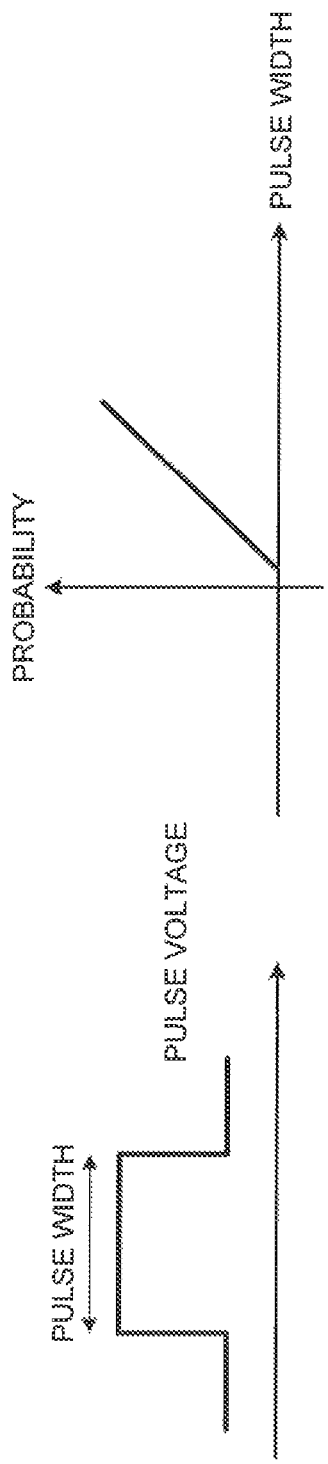

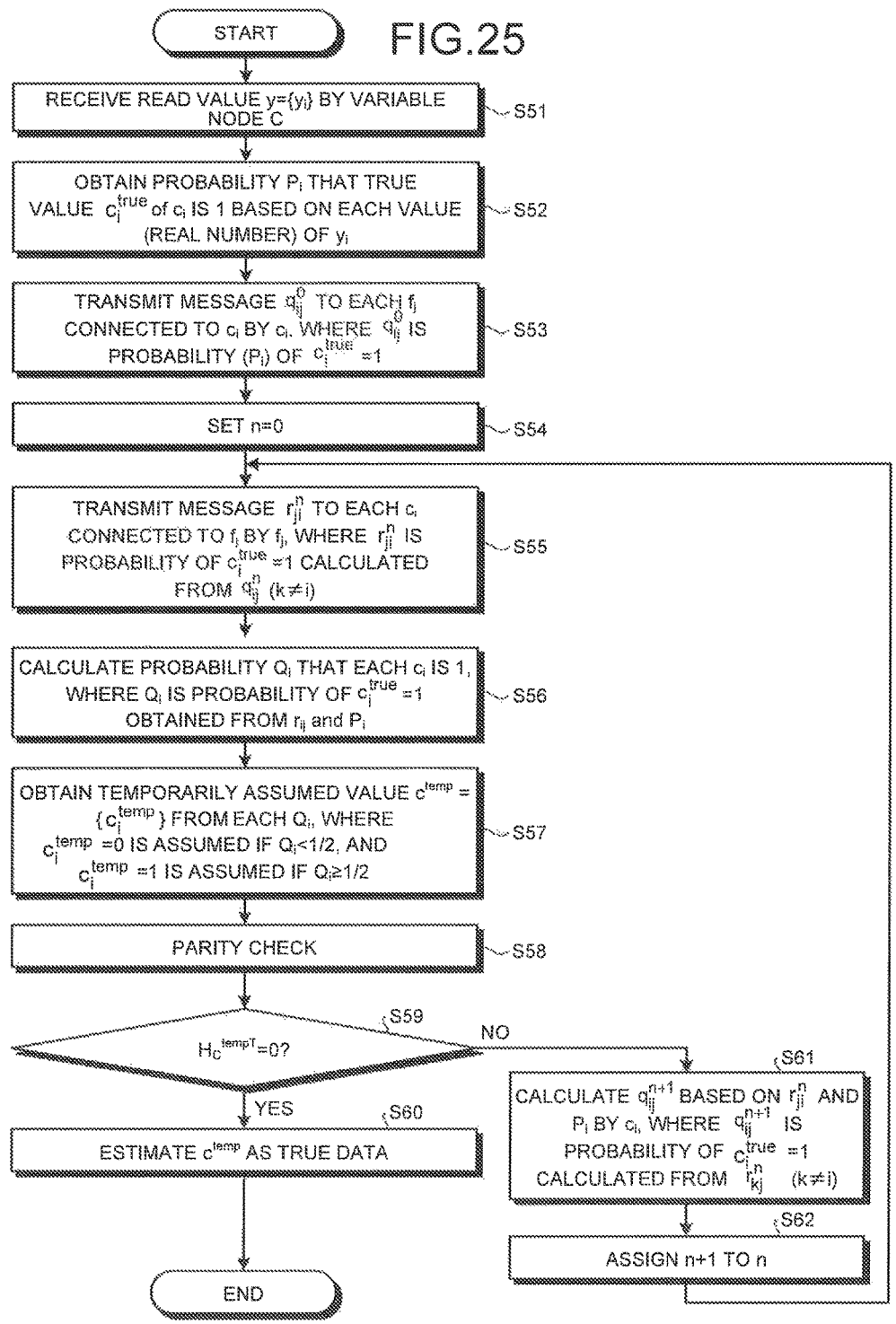

FIG.26A
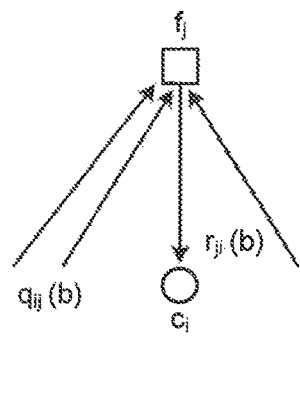
FIG.26B
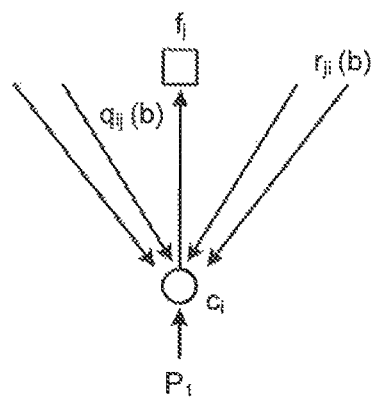
FIG.27
$$\hat{c}_i = \begin{cases} 1 & \text{if } Q_i(1) > Q_i(0) \\ 0 & \text{else} \end{cases}$$

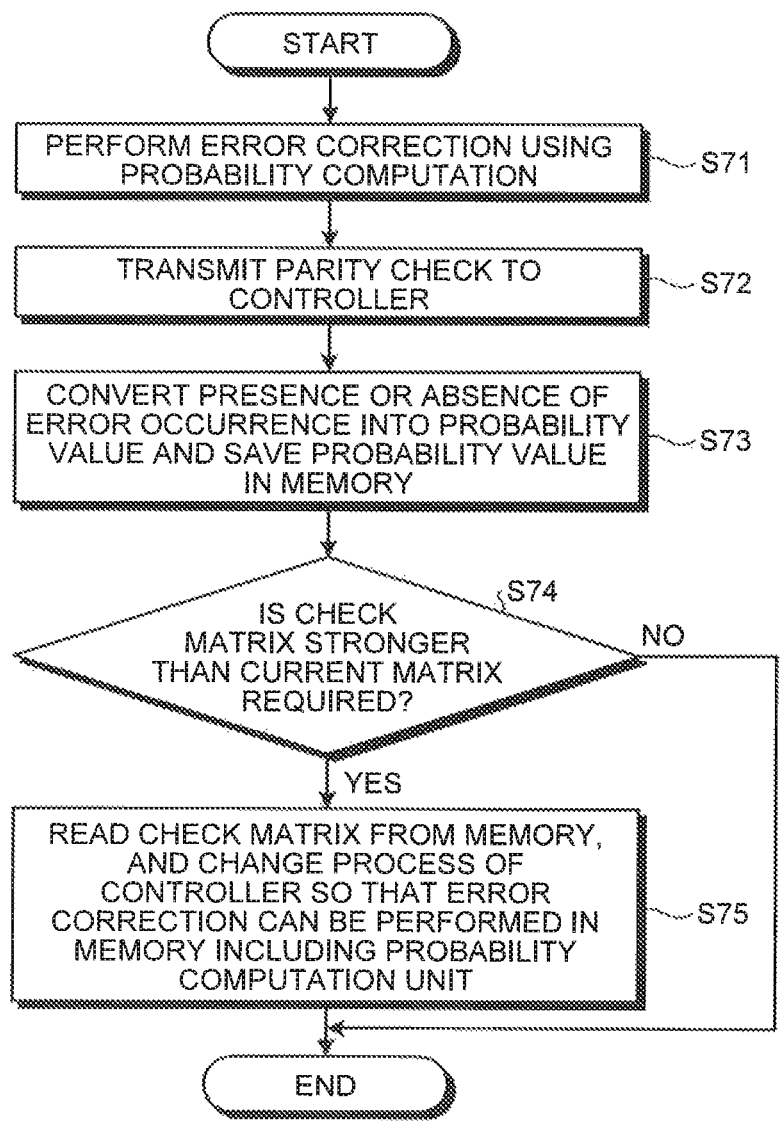

MEMORY SYSTEM, ERROR CORRECTION DEVICE, AND ERROR CORRECTION METHOD

CROSS-REFERENCE TO RELATED APPLICATION (S)

This application is based upon and claims the benefit of priority from Japanese Patent Application No. 2014-191615, filed on Sep. 19, 2014; the entire contents of which are incorporated herein by reference.

FIELD

Embodiments described herein relate generally to a memory system, an error correction device, and an error correction method.

BACKGROUND

Magnetic hard disk drives (HDDs) are known as memory devices included computer systems, for example, as typical host systems. Furthermore, solid state drives (SSDs) including nonvolatile semiconductor memories such as NAND flash memories, embedded NAND flash memories, and the like are known as memory devices. SSDs and embedded NAND flash memories are classified into memory devices but can also be deemed to be memory systems that are enlarged in size.

Such a memory system includes an interface, a first memory, a second memory, and a controller, for example. The first memory stores data. The second memory is a buffer memory used in writing and reading data. The first memory is a nonvolatile memory that is larger than the second memory but has a lower access speed. The second memory is also used for compensating for the difference between the transmission rate of the interface and the writing speed or reading speed of the first memory.

The first memory is a nonvolatile flash memory, for example. The second memory is a volatile DRAM or SRAM, for example. DRAM stands for a "dynamic random access memory." SRAM stands for a "static random access memory." In such a memory system, write data transmitted from a host system are coded for error correction (ECC) and then written into the first memory. Data read from the first memory are subjected to an error correction process and a decoding process, and then transmitted to the host system.

The error rate is higher as the first memory is larger. The error rate is also higher as the number of times of writing and erasing of the first memory increases. To compensate for this, a functional block for performing error correction according to the error occurrence tendency of the first memory is provided in the periphery of the controller and the memory. The lifetime of the first memory can be effectively extended by obtaining the error occurrence tendency and performing optimum "reading," "writing" and "erasing" operations.

However, in order to analyze optimum "reading," "writing" and "erasing" operations and implement algorithms or parameters in the controller for each of generations and each of characteristics of design and miniaturization of the first memory, the overall operation of the first memory needs to be tested in an exhaustive manner. There has thus been a problem in which it requires a long time for analysis of the operations even with a specialized analysis program.

Algorithms or parameters for an average operation tendency of first memories produced in large quantities can be implemented in controllers. It is, however, difficult to implement algorithms or parameters based on the characteristics of each first memory (=individual characteristics of each LSI chip) in a controller. LSI stands for "large scale integration." in the memory systems of related art, for the reasons described above, it is difficult to optimize operation for each first memory and it is difficult to effectively extend the life time of first memories. The memory systems of the related art are therefore systems with low reliability.

BRIEF DESCRIPTION OF THE DRAWINGS

FIG. 1 is a diagram illustrating a basic configuration of a memory system according to an embodiment;

FIG. 2 is a hardware configuration diagram of the memory system according to the embodiment;

FIGS. 21A and 21B are graphs for explaining a first technique of controlling probability values in the memory system according to the embodiment;

FIGS. 22A and 22B are graphs for explaining a second technique of controlling probability values in the memory system according to the embodiment;

FIG. 25 is a flowchart illustrating procedures of a basic error correction using the LDPC code performed by a probability computation unit of the memory system according to the embodiment;

FIGS. 26A and 26B are diagrams for explaining transmission and reception of messages between check nodes and variable nodes in an error correction using the LDPC code performed by the probability computation unit of the memory system according to the embodiment.

FIG. 27 is an expression for explaining operation of estimating a true value of digital data associated with a variable node in the error correction using the LDPC code performed by the probability computation unit of the memory system according to the embodiment; and FIG. 28 is a flowchart illustrating procedures of the error correction using the LDPC code performed by the probability computation unit of the memory system according to the embodiment.

DETAILED DESCRIPTION

Figure 3:
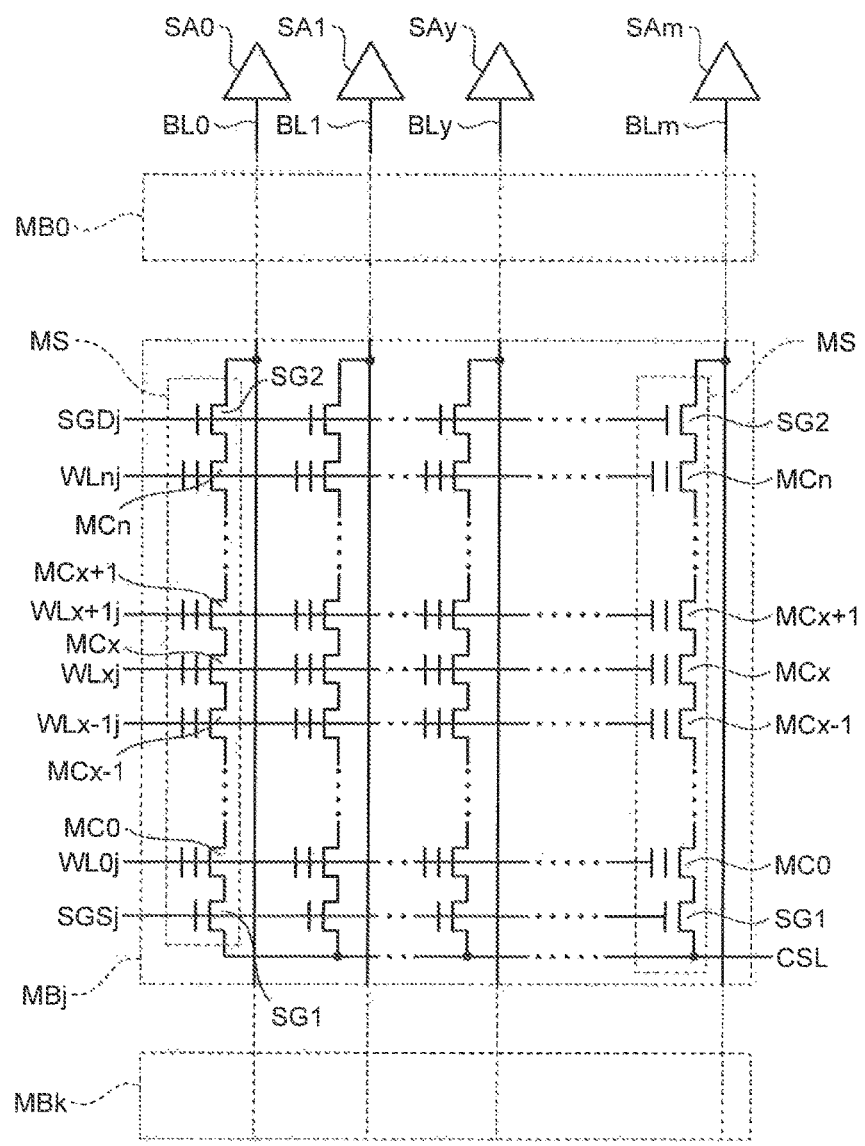
FIG. 3 is a circuit diagram of a memory cell array of a first memory in the memory system according to the embodiment.

According to an embodiment, a memory system includes a memory and a computation unit. Into the memory, data are written. The memory stores therein multiple check matrices. Each of the check matrices is associated with the number of errors in the written data. The computation unit is configured to perform a first error correction on the written data by selectively using, from among the check matrices, a check matrix associated with the number of errors recognized in the written data.

A memory system according to an embodiment will be described below as an example with reference to the drawings.

First, FIG. 1 illustrates a basic configuration of a memory system. As illustrated in FIG. 1, the memory system includes a controller 20, a first memory 100, and a second memory 200.

The first memory 100 is a memory for saving files having the largest memory capacity in the memory system and excellent reliability. The first memory 100 can be constituted by a NAND flash memory, for example. The second memory 200 is a memory having a smaller memory capacity than the first memory 100, but having excellent random accessibility allowing data to be read/written therefrom/thereto at a higher speed. Examples of the second memory 200 include volatile memories such as a DRAM and a SRAM. Examples of the second memory 200 further include nonvolatile memories such as a MRAM, a ReRAM, a PCRAM and a FeRAM. MRAM stands for a "magnetoresistive random access memory." ReRAM stands for a "resistance random access memory." PCRAM stands for a phase change random access memory." FeRAM stands for a "ferroelectric random access memory."

For the first memory 100, priority is given to a large memory capacity, and elements for memory cells thereof are elements made through ultra-fine microfabrication. In a case where the first memory 100 is a NAND flash memory, for example, a typical dimension of one memory element constituted by a transistor having a floating gate is reduced to 19 nm or smaller. Thus, the sequence of operations of "read," "write" and "erase" has a complex effect on memory cells and causes such an error rate that is not negligible. The error rate is not only affected by initial failure immediately after production but also increased with worn cell structures and materials as a result of being used by users.

A typical memory system is provided with an error correction unit for reducing the error rate to zero before transmitting data to a host. At a low error rate, an error correction system using BCH codes based on digital algebraic operations of 0 and 1 of data is often used. In this case, it is relatively easy to generate a dedicated circuit.

With the increase in memory capacity of memory cells, however, the behavior of bit errors varies among generations and among products. It is thus preferable to apply an error correction technique or parameters optimized for each memory cell. In particular, owing to the increase in memory capacity, there are cases where an error correction technique using LDPC codes is used as an error correction technique utilizing analog information depending on the error rate in reading. LDPC stands for "low density parity check." The need for many types of controllers to which such error correction techniques are applied will make the time for development of memory systems longer and have negative influence on the reliability of memory systems.

It is preferable that a memory system be capable of autonomously processing information on "read," "write" and "erase" of the first memory 100 into statistics in the memory system, recognizing occurrence or errors therein, and managing the reliability thereof.

The second memory 200 is used for information processing for complicated error correction, logical-to-physical address translation, or the like. The second memory 200 is much faster than the first memory 100 and is desirably used for information processing rather than memory retention.

In the embodiment described below, a configuration of and a method for a memory system that efficiently performs computation within the memory system so as to process information on "read," "write" and "erase" of the first memory 100 into statistics mainly within the second memory 200 and obtain an optimal sequence will be disclosed. Hereinafter, specific description will be provided.

FIG. 2 is a hardware configuration diagram of the memory system according to the embodiment. As illustrated in FIG. 2, the memory system includes an interface (I/F) 10, a controller 20, the first memory 100, the second memory 200, and a data bus (bus) 300. The interface 10, the controller 20, the first memory 100, and the second memory 200 are capable of mutually transmitting and receiving data via the data bus 300.

The interface 10 is connected to a host device (host system) outside of the memory system via a bus such as AMBA (advanced microcontroller bus architecture). The bus for connection with the host device may selected from SATA (serial advanced technology attachment), PCI Express, eMMC (embedded MMC), UFS (universal flash memory), USB (universal serial bus), and the like as appropriate. Two or more types of bus lines may be used in the memory system to support different standards or the like.

The interface 10 receives requests from the host device outside of the memory system. For example, the interface 10 receives a write request requesting to write data into the first memory 100 and a read request requesting to read data from the first memory 100 from the host device. A write request may contain data requested to be written, and a RAW address (physical address) indicating a position in the first memory 100 into which the data are to be written. Alternatively, a write request may contain data requested to be written, and a logical address indicating a location in to which the data requested to be written are allocated among virtual space addresses in a program.

A read request may contain a RAW address indicating a position in the first memory 100 from which data are to be read. Alternatively, a read request may contain a logical address indicating a location to which data requested to be read are allocated among virtual space addresses in a program. A logical address is specified by the host device.

The controller 20 is a control device configured to control read and write of data from/to the first memory 100 in response to requests from the host device received by the interface 10. The controller 20 is connected to an address decoder 102 via an address signal line 110, and connected to the second memory 200 via a control signal line 120. The controller 20 is also connected to a register 105 via a control signal line 130, and connected to the interface 10 via a control signal line 140.

The controller 20 also includes a RAM or the like that serves as a work area for controlling transmission and reception of signals between the interface 10, the second memory 200, and the first memory 100. The controller 20 further includes an error correcting function (ECC function) to be applied on data output from the first memory 100. The controller 20 performs an error correction by the ECC function on data to be finally output to the outside (host device) of the memory system via the interface 10, and outputs the resulting data.

The first memory 100 is a device capable of storing data supplied from outside (the host device, for example) of the memory system. An example in which the first memory 100 is constituted by a NAND flash memory will be explained in the description below, but the first memory 100 is not limited thereto. Hereinafter, specific details of the first memory 100 will be described.

As illustrated in FIG. 2, the first memory 100 includes a memory cell array 101, the address decoder 102, a selection unit 103, a sense amplifier 204, and the register 105. In the memory cell array 101, multiple word lines WL (WORD LINES WL) extending in a row direction (the horizontal direction in FIG. 2) and multiple bit lines BL (BIT LINES BL) extending in a column direction (the vertical direction in FIG. 2) are arranged. The word lines WL are connected to the address decoder 102 via the selection unit 103. The bit lines BL are connected to the sense amplifier 104.

The memory cell array 102 has multiple memory cells arranged in a matrix, the memory cells corresponding to respective intersections of the word lines WL and the bit lines BL. Each of the memory cells is a memory cell capable of storing binary or higher order information according to the amount of charge accumulated in a floating gate electrode. In the following description, the memory cells may be referred to as "first memory cells." In one example, each of the first memory cells is an FG memory cell including a floating gate (conductive layer) formed on a p-type semiconductor substrate with a gate insulating film therebetween and a control gate formed on the floating gate with an inter-gate insulating film. Note that other types of memory cells such as MONOS memory cells may be used instead of FG memory cells.

FIG. 3 is a diagram illustrating a schematic configuration of the memory cell array 101. In the example of FIG. 3, m+1 (m≥1) bit lines BL0 to BLm are provided. The bit lines BL0 to BLm are arranged in parallel with one another. In the description below, the bit lines BL0 to BLm will be simply referred to as "bit lines BL" unless the bit lines BL0 to BLm are distinguished from one another. Furthermore, in the example of FIG. 3, m+1 amplifiers SA0 to SAm that are associated one-to-one with the bit lines BL0 to BLm are provided. The sense amplifier 104 illustrated in FIG. 2 includes these m+1 amplifiers SA0 to SAm. Although a case in which the amplifiers SA0 to SAm are provided for the bit lines BL0 to BLm, respectively, is illustrated in the example of FIG. 3, a configuration in which two or more bit lines BL share one amplifier, for example, may alternatively be employed.

Furthermore, as illustrated in FIG. 3, the memory cell array 101 is provided with k+1 (k≥1) memories MB0 to MBk. The memories MB0 to MBk are arranged in the column direction along the bit lines BL0 to BLm. In the description below, the memories MB0 to MBk will be simply referred to as "memories MB" unless the memories MB0 to MBk are not distinguished from one another. In each of the memories MB0 to MBk, a NAN) string MS is provided along each of the bit lines BL0 to BLm. The NAND string MS includes a first memory cell group constituted by n+1 (n≥1; n=31, for example) first memory cells MC0 to MCn, and selection gate transistors SG1 and SG2 provided at both ends of the first memory cell group. In the description below, the selection gate transistors may simply referred to as "selection gates."

The first memory cells MC0 to MCn are connected in series to each other, and the selection gate SG1 is connected in series to the first memory cell MC0 at one end is connected while the selection gate SG2 is connected in series to the first memory cell MCn at the other end. One ends of the NAND strings MS provided along the respective bit lines BL0 to BLm are connected to a common cell source line CSL via the selection gates SG1, and the other ends of the NAND string MS are connected to the respective bit lines BL0 to BLm via the selection gates SG2.

As illustrated in FIG. 3, in the memory MBj, word lines WL0j to WLnj and selection gate lines SGSj and SGDj are arranged perpendicularly to the bit lines BL0 to BLm. Note that the word lines WL0j to WLnj are connected to gate electrodes of the first memory cells MC0 to MCn, respectively, the selection gate line SGSj is connected to a gate electrode of the selection gate SG1, and the selection gate line SGDj is connected to a gate electrode of the selection gate SG2. The other memories MB have the same configuration. In the description below, the word lines WL0j to WLnj will be simply referred to as "word lines WL" unless the word lines WL0j to WLnj are not distinguished from one another.

Note that the first memory cell MCn of a NAND string MS provided along the bit line BL0 among the m+1 NAND strings MS included in the memory MBj is not exactly arranged at the intersection of the bit line BL0 and the word line WLnj, but the first memory cell MCn can be deemed to be arranged at a position corresponding to the intersection of the bit line BL0 and the word line WLnj. Similarly, the first memory cell MCn of a NAND string MS provided along the bit line BLm among the m+1 NAND strings MS included in the memory MBj is not exactly arranged at the intersection of the bit line BLm and the word line WLnj, but the first memory cell MCn can be deemed to be arranged at a position corresponding to the intersection of the bit line BLm and the word line WLnj. The other first memory cells MC can also be deemed similarly.

Next, an outline of operation in reading data from the first memory 100 will be described. In reading data, a predetermined charging voltage is first supplied to each bit line BL to generate a charged state in which charge is accumulated in advance in each bit line BL. This is called precharge. An example of the j-th memory MBj (see FIG. 3) will be described. A voltage of 4 to 5 V, for example, is supplied to the selection gate lines SGSj and SGDj as a voltage to switch the selection gates SG1 and SG2 to an ON state. In addition, a voltage of 0 V, for example, is supplied to a word line corresponding to a selected page as a voltage V_READ for reading data (may also be referred to as a "read voltage V_READ" in the description below). Furthermore, a voltage of 5 V, for example, is supplied to the other 31 word lines WL (n=31 in this example) as a predetermined voltage.

In the first memory cell (F-MOSFET) whose gate electrode is connected to the word line WL to which the read voltage V_READ is supplied, whether or not the source and the drain thereof is are electrically connected is determined on the basis of whether or not a threshold voltage Vth is higher or lower than 0 V. When the source and the drain of the FG-MOSFET are electrically connected with each other, the charge precharged in the bit line BL is discharged to ground potential through the NAND string MS, which lowers the potential of the bit line BL. As a result, the signal of the bit line BL becomes a low level ("0").

When the source and the drain of the FG-MOSFET are not electrically connected with each other, the charge precharged in the bit line BL is not discharged and the charging voltage is maintained. As a result, the signal of the bit line BL becomes a high level ("1"). In this manner, "0" or "1" can be read as a value indicating the memory state (threshold state) of a first memory cell (FG-MOSFET) from which data are to be read.

Next, an outline of operation in writing data into the first memory 100 will be described. In writing data (PROGRAM), a voltage of 0 V, for example, is supplied to a bit line BL into which data are to be written as a voltage for selection and a power supply voltage Vdd, for example, is supplied to a bit line BL into which data are not to be written as a voltage for non-selection depending on data temporarily held in the register 105. Writing data corresponds to changing the threshold of a first memory cell (FG-MOSFET). An example of the j-th memory MBj will be described. A voltage of 4 to 5 V, for example, is supplied to the selection gate lines SGSj and SGDj as a voltage to switch the selection gates SG1 and SG2 to an ON state. In addition, a voltage of 15 to 20 V, for example, is supplied to a word line WL corresponding to a selected page as a voltage V_PROGRAM for writing data (may also be referred to as a "write voltage V_PROGRAM" in the description below). A predetermined voltage (10 V, for example) is supplied to the other 31 word lines.

As a result of this write operation, a voltage of 0 V for selecting a bit line BL is transferred as channel potential to the first memory cell into which data are to be written (the first memory cell located at the intersection of the word line WL to which the write voltage V_PROGRAM is supplied and the bit line BL to which a voltage of 0 V for selection is supplied). Thus, a voltage corresponding to V_PROGRAM is applied to the FG of the first memory cell to which data are to be written, and electrons are injected and accumulated in the FG from the channel. Accumulation of electrons makes the threshold of the FG-MOSFET higher. This state is a state in which "0" is written. At the initial state after production, electrons are not accumulated in the FG of a FG-MOSFET and the threshold thereof is in a state lower than 0 V. This state is a state in which "1" is written.

Specifically, a NAND flash memory has an operation principle in which "1" is initially written in all the first memory cells and the state of a first memory cell is changed to a state in which "0" is written as a result of data writing operation.

Note that, in a NAND string MS connected to a bit line BL to which the voltage for non-selection (power supply voltage Vdd in this example), electrons are not injected to the FGs even when a voltage is applied to word lines WL. This is because of the following reason. Since the voltage Vdd for non-selection is applied to the bit line BL connected to the NAND string MS, the channel potential of a selected FG-MOSFET is raised to a high state via the channel of a non-selected FG-MOSFET in the NAND string MS. Thus, only a voltage that is sufficiently smaller than the write voltage V_PROGRAM is applied to the FG of the first memory cell to which data are to be written connected to the selected word line WL (the word line WL to which the write voltage V_PROGRAM is supplied).

Next, an outline of operation in erasing data stored in the first memory 100 (ERASE) will be described. An example of the j-th memory MBj (see FIG. 3) will be described. The word line voltage and the bit line voltage are set to 0 V and the floating potential, respectively, in the area of all the word lines WL and bit lines BL surrounded by the selection gates SG1 and SG2, that is, the memory MBj. In this state, an erase voltage V_ERA is then applied to wells in the block to extract electrons from all the first memory cells to the substrate wells.

In writing and erasing, the changes in threshold vary among the first memory cells connected to the same word line WL. Thus, determination on a first memory cell where the change is small is made through a procedure (Verify) for verification thereof. Furthermore, writing or erasing is additionally performed in a bit line BL corresponding to a first memory cell where the amount of change in threshold is not sufficient. A NAND flash memory is also capable of multi-valued operation depending on the magnitude of the threshold. Multi-valued operation is the same as binary operation in basic operation but differs therefrom in detailed sequence since, in multi-valued operation, the voltage range in reading is divided into fine levels and writing is performed so that the threshold is divided into fine levels while the amount of change in threshold is verified. Furthermore, since the threshold is divided into fine levels, multi-valued operation is likely to be affected by a change in threshold due to capacity coupling capacitive coupling between adjacent first memory cells. Thus, a design for writing in such a manner that pages (word lines) into which data are written are not adjacent to each other may be applied.

The first memory 100 described above is constituted by a NAND flash memory, but the first memory 100 is not limited thereto and any memory medium that is a semiconductor memory having memory nonvolatility can be used. For example, the first memory 100 may be a nonvolatile memory such as a MRAM, a ReRAM, a FeRAM, or a PCRAM. Basically, the first memory 100 may be any memory device including multiple first memory cells arranged in a matrix the positions of the first memory cells corresponding to intersections of multiple first wires and multiple second wires.

Next, the second memory 200 will be described. In the case of the memory system according to the embodiment, the second memory 200 bears the function of L2P conversion. Word lines WX of the second memory 200 are connected to the word lines WL of the first memory 100 via the selection unit 103. In addition, bit lines BX of the second memory 200 may be connected to a data bus. An example in which the second memory 200 is constituted by a FeRAM will be explained in the description below, but the second memory 200 is not limited thereto.

Figure 4:
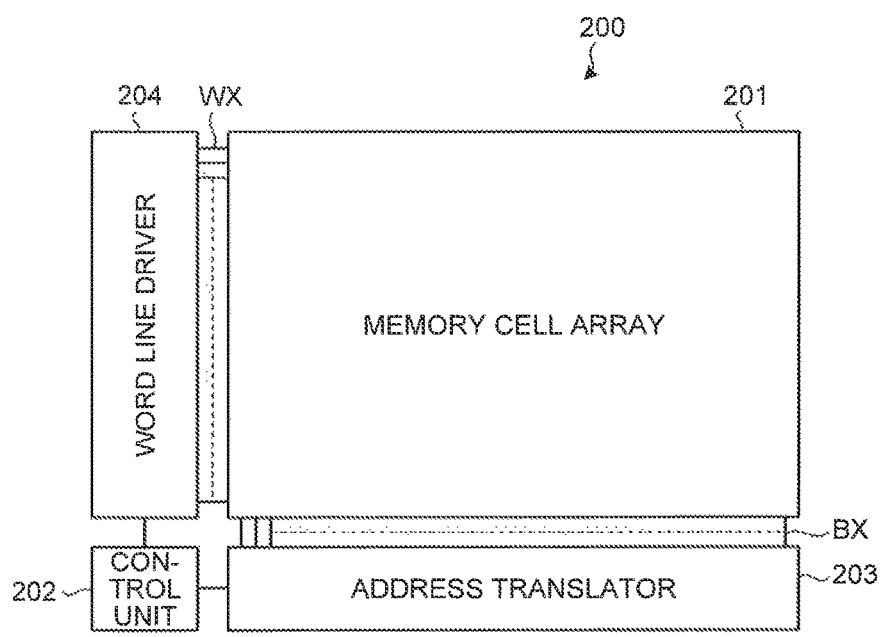
FIG. 4 is a hardware configuration diagram of a second memory of the memory system according to the embodiment.

FIG. 4 is a diagram illustrating an example configuration of the second memory 200. As illustrated in FIG. 4, the second memory 200 includes a memory cell array 201, a control unit 202, an address translation unit 203, and a word line drive unit 204.

The memory cell array 201 includes multiple second memory cells arranged in a matrix, the positions of the second memory cells corresponding to intersections of the word lines WX and the bit lines BX. The word lines WX are each connected to one of the word lines WL of the first memory 100. In addition, the bit lines BX are associated in advance with respective logical addresses to be specified by the host device.

A second memory cell includes a variable resistive element held between a word line WX and a bit line BX. The resistive state of a second memory cell is set at least to a first resistive state or to a second resistive state lower in resistance than the first resistive state depending on voltages applied to the word line WX and the bit line BX connected to the second memory cell.

Figure 5:
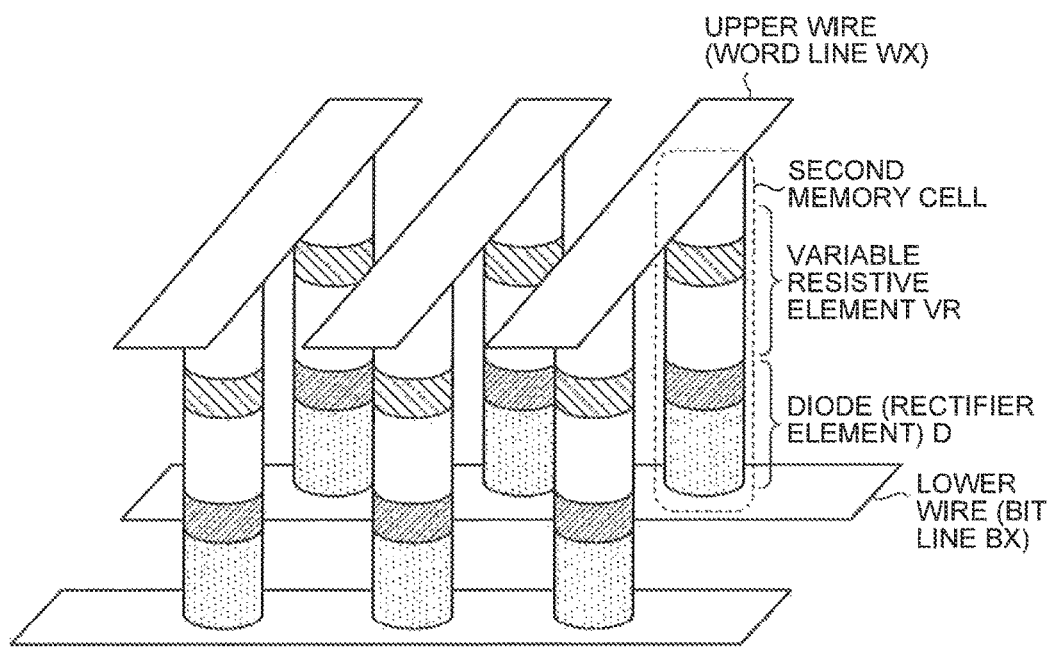
FIG. 5 is a diagram illustrating a structure of a memory cell array provided in the memory system according to the embodiment.

FIG. 5 is a diagram illustrating an example of a concrete structure of the memory cell array 201. As illustrated in FIG. 5, the memory cell array 201 has multiple upper wires (the word lines WX in this example) extending in a first direction (the vertical direction in FIG. 5). The memory cell array 201 is also provided with multiple lower wires (the bit lines BX in this example) extending in a second direction (the horizontal direction in FIG. 5) perpendicular to the first direction in such a manner that the lower wires are opposed in the vertical direction to and intersect with the upper wires. At each intersection, a cylindrical second memory cell is formed between an upper wire and a lower wire. In the example of FIG. 5, a second memory cell includes a variable resistive element VR and a diode (rectifier element) D connected in series. The diode D is provided to suppress sneak current (a so-called sneak path) between wires.

In this example, the variable resistive element VR switches between two resistive states: a high resistive state and a low resistive state. For example, the voltages of a word line WX and a bit line BX are controlled so that a predetermined forward voltage is applied between both ends of a second memory cell. As a result, a conductive filament of a diffused metal element is formed in the variable resistive element VB, which switches the variable resistive element VR to the low resistive state. Furthermore, voltages of a word line WX and a bit line BX are controlled so that a predetermined reverse voltage is applied between both ends of a second memory cell. As a result, a diffused metal element in the variable resistive element VR is collected and a conductive filament is thus eliminated, which switches the variable resistive element VR to the high resistive state. Alternatively, for example, the variable resistive element VR may be switched among three or more resistive states.

The size of the memory cell array in the second memory 200 is 8 Mbit×8 Mbit (that is, 1 MByte×1 MByte), for example. In this case, the memory capacity is 1 TByte. When a chip has an area of 2 cm×2 cm, and if wires have a width of 10 nm and a line repetition pitch of 20 nm, 2 cm÷20 nm=1E6 wires can be formed. Furthermore, in a case or a ReRAM, since multiple layers can be formed, a size of 8 Mbit×8 Mbit or larger can be achieved when eight or more layers are formed.

Figure 6:
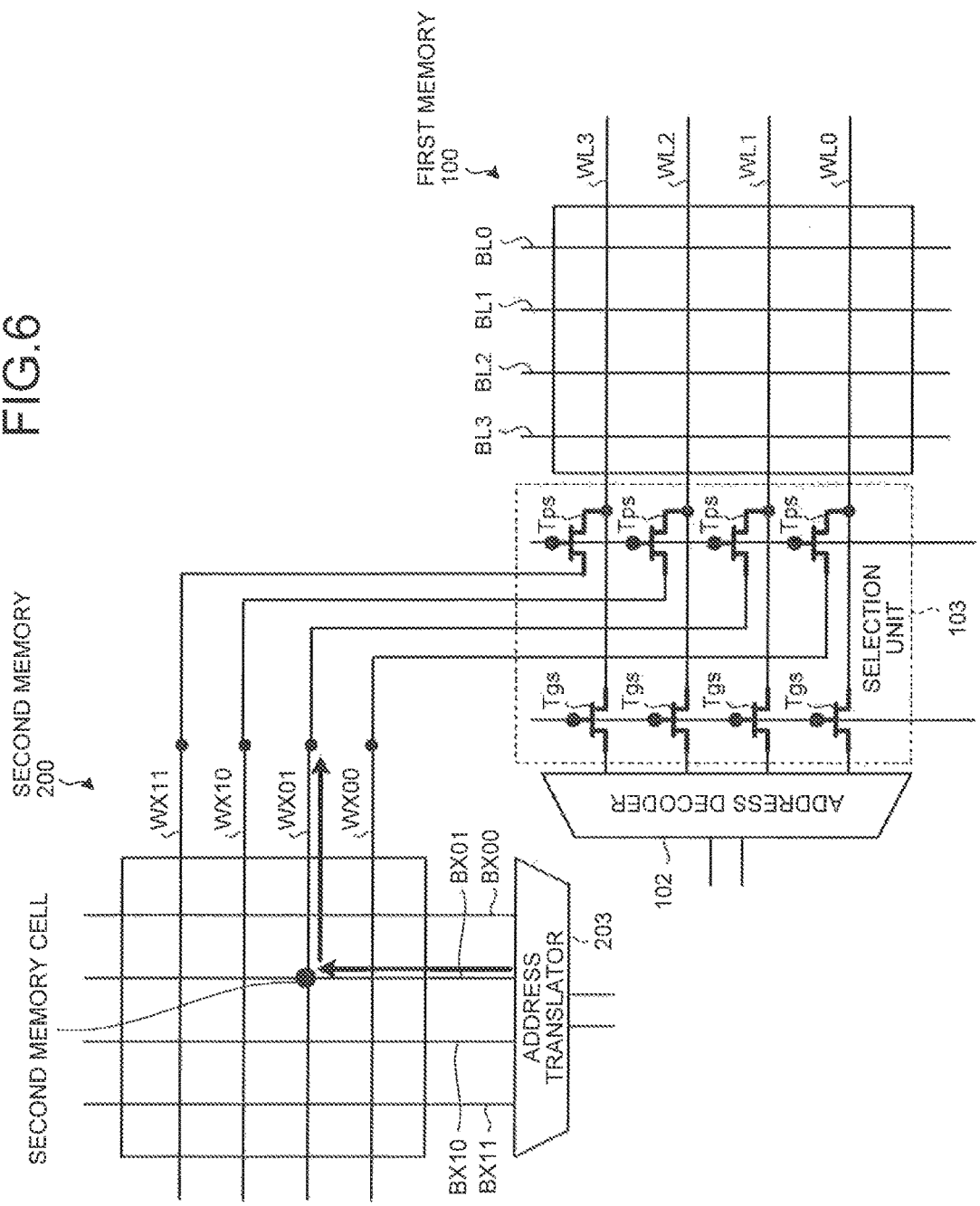
FIG. 6 is a diagram for explaining the relation of connection between the first memory and the second memory provided in the memory system according to the embodiment.

FIG. 6 is a diagram for explaining the relation of connection between the first memory 100 and the second memory 200. For simplification, FIG. 6 illustrates a configuration in which four word lines WX (WX00 to WX11) and four bit lines BX (BX00 to BX11) are arranged in the memory cell array 201 of the second memory 200. In addition, FIG. 6 illustrates a configuration in which four word lines WL (WL0 to WL3) and four bit lines BL (BL0 to BL3) are arranged in the memory cell array 101 of the first memory 100.

Furthermore, the selection unit 103 of the first memory 100 illustrated in FIG. 6 includes multiple pass transistors Tps and multiple gate transistors Tgs. The pass transistors Tps are associated one-to-one with the word lines WX of the second memory 200, and each pass transistor Tps switches between connection and disconnection between a word line WX and any one word line WL of the first memory 100 under the control of the controller 20. For reading data from or writing data into the first memory 100 on the basis of a logical address, the controller 20 controls each of the pass transistors Tps to be in the ON state and controls each of the gate transistors Tgs to be in the OFF state. Alternatively, the component that controls ON/OFF of the pass transistors Tps may be the control unit 202 of the second memory 200, for example.

The gate transistors Tgs are associated one-to-one with the word lines WL of the first memory 100, and each gate transistor Tgs switches between connection and disconnection between a word line WL and the address decoder under the control of the controller 20. For reading data from or writing data into the first memory 100 on the basis of a RAW address, the controller 20 controls each of the gate transistors Tgs to be in the ON state and controls each of the pass transistors Tps to be in the OFF state.

As illustrated in FIG. 6, each of the four word lines WX (WX00 to WX11) of the second memory 200 is connected to one of the four word lines WL (WL0 to WL3) of the first memory 100 via a pass transistor Tps. In the example of FIG. 6, the word line WX11 is connected to the word line WL3. The word line WX10 is connected to the word line WL2. The word line WX01 is connected to the word line WL1. Furthermore, the word line WX00 is connected to the word line WL0. Note that the connection between a word line WX and a word line WL includes both a connection through a pass transistor Tps or the like as illustrated in FIG. 6 and a direct connection without intervention of a pass transistor Tps or the like.

In reading data or writing data based on a logical address, a logical address is input to the address translation unit 203 of the second memory 200, and one bit line BX is selected. In the example of FIG. 6, a logical address indicating a two-bit value is input and one of the four bit lines BX is selected. In other words, it can be deemed that a logical address is associated in advance with each of the four bit lines BX.

The resistive state of each of the second memory cells is set to either a high resistive state or a low resistive state according to the association between the logical address and a word line WL of the first memory 100 (in other words, a physical address specifying a page in the first memory 100). This association refers to association between the logical address and a word line WL (a word line WL to be selected) to which read voltage V_READ for reading data or write voltage V_PROGRAM for writing data is supplied in reading or writing data based on the logical address.

For example, in FIG. 6, it is assumed that a logical address "01" is associated in advance with a bit line BX01 of the second memory 200. Then, in reading or writing data in which the logical address "01" is specified, when the word line WL1 of the first memory 100 is to be selected (when the logical address "01" and the word line WL1 of the first memory 100 are associated), the resistive state of the second memory cell corresponding to the intersection of the bit line BX01 associated with the logical address "01" and the word line WX01 connected to the word line WL1 of the first memory 100 is set to a low resistive state in advance. In contrast, the resistive states of three second memory cells corresponding to the intersections of the bit line BX01 and the other three word lines (WX00, WX10, WX11) are set to high resistive states in advance.

In reading data based on a logical address, a first voltage is supplied to a bit line BX associated with a specified logical address so that read voltage V_READ is supplied to a word line WL (a word line WL in the first memory 100 connected via the selection unit to a word line WX connected to the second memory cell in a low resistive state) in the first memory 100 associated with the second memory cell in the low resistive state connected to the bit line BX associated with the specified logical address. In writing data based on a logical address, a second voltage is supplied to a bit line BX associated with a specified logical address so that write voltage V_PROGRAM is supplied to a word line WL in the first memory 100 associated with a second memory cell in a low resistive state connected to the bit line BX associated with the specified logical address.

In FIG. 6, when it is assumed that a predetermined voltage (the first voltage or the second voltage) is supplied to the bit line BX01 associated with the logical address "01" in reading of data or writing of data based on the logical address "01," for example, since the second memory cell corresponding to the intersection between the bit line BX01 and the word line WX01 is set in the low resistive state as described above, current flows in a direction from the bit line BX01 to the word line WX01. This serves as an electric signal, which is transferred to the word line WL1 of the first memory 100 via the selection unit 103.

The description is continued referring back to FIG. 4. The control unit 202 controls the operation of the second memory 200. The control unit 202 is connected to the controller 20 via the control signal line 320 illustrated in FIG. 2. The control unit 202 has a function of receiving a logical address contained in a read request from the host device from the controller 20. The control unit 202 also has a function of controlling supply of a predetermined voltage (may also referred to as the "first voltage" in the description below) to a bit line BX associated with the a logical address received from the controller 20 so that read voltage V_READ is supplied to a word line WL in the first memory 100 associated with the second memory cell in a low resistive state connected to the bit line BX associated with the logical address received from the controller 20. The first voltage is preferably set in view of a voltage drop due to a conductor (such as wires or the second memory cell in the low resistive state) present before the word line WL in the first memory 100.

Upon receiving a read signal and a logical address (a logical address contained in a read request) from the controller 20, the control unit 202 sends the received logical address to the address translation unit 203. The control unit 202 also instructs a voltage generation circuit, which is not illustrated, to generate the first voltage. The address translation unit 203 decodes the logical address provided from the control unit 202, and selects the associated bit line BX on the basis of the decoding result. At this point, the first voltage generated by the voltage generation circuit, which is not illustrated, is supplied to the bit line BX selected by the address translation unit 203.

The control unit 202 also has a function of receiving a logical address contained in a write request from the host device from the controller 20. The control unit 202 also has a function of controlling supply of a predetermined voltage (may also referred to as the "second voltage" in the description below) to a bit line BX associated with a logical address received from the controller 20 so that write voltage V_PROGRAM for writing data is supplied to the word line WL in the first memory 100 associated with the second memory cell in a low resistive state connected to the bit line BX. The second voltage is preferably set in view of a voltage drop due to a conductor (such as wires or the second memory cell in the low resistive state) present before the word line WL in the first memory 100.

Upon receiving a write signal and a logical address (a logical address contained in a write request) from the controller 20, the control unit 202 sends the received logical address to the address translation unit 203. The control unit 202 also instructs a voltage generation circuit, which is not illustrated, to generate the second voltage. The address translation unit 203 decodes the logical address provided from the control unit 202, and selects the associated bit line BX on the basis of the decoding result. At this point, the second voltage generated by the voltage generation circuit, which is not illustrated, is supplied to the bit line BX selected by the address translation unit 203.

The word line drive unit 204 outputs a voltage to be supplied to each word line WX under the control of the control unit 202

Although a ReRAM is used for the second memory 200, a nonvolatile memory such as a MRAM, a PCRAM, or a FeRAM may alternatively be used. Basically, the second memory 200 may be any memory device including multiple second memory cells in which the second memory cells are arranged in a matrix at positions corresponding to intersections of multiple third wires each connected to one of the first wires and multiple fourth wires each associated in advance with a logical address to be specified by the host device and in which the resistive state of each of the second memory cells is set at least to a first resistive state or a second resistive state lower in resistance than the first resistive state depending on the association between the logical address and the first wire.

Figure 7:
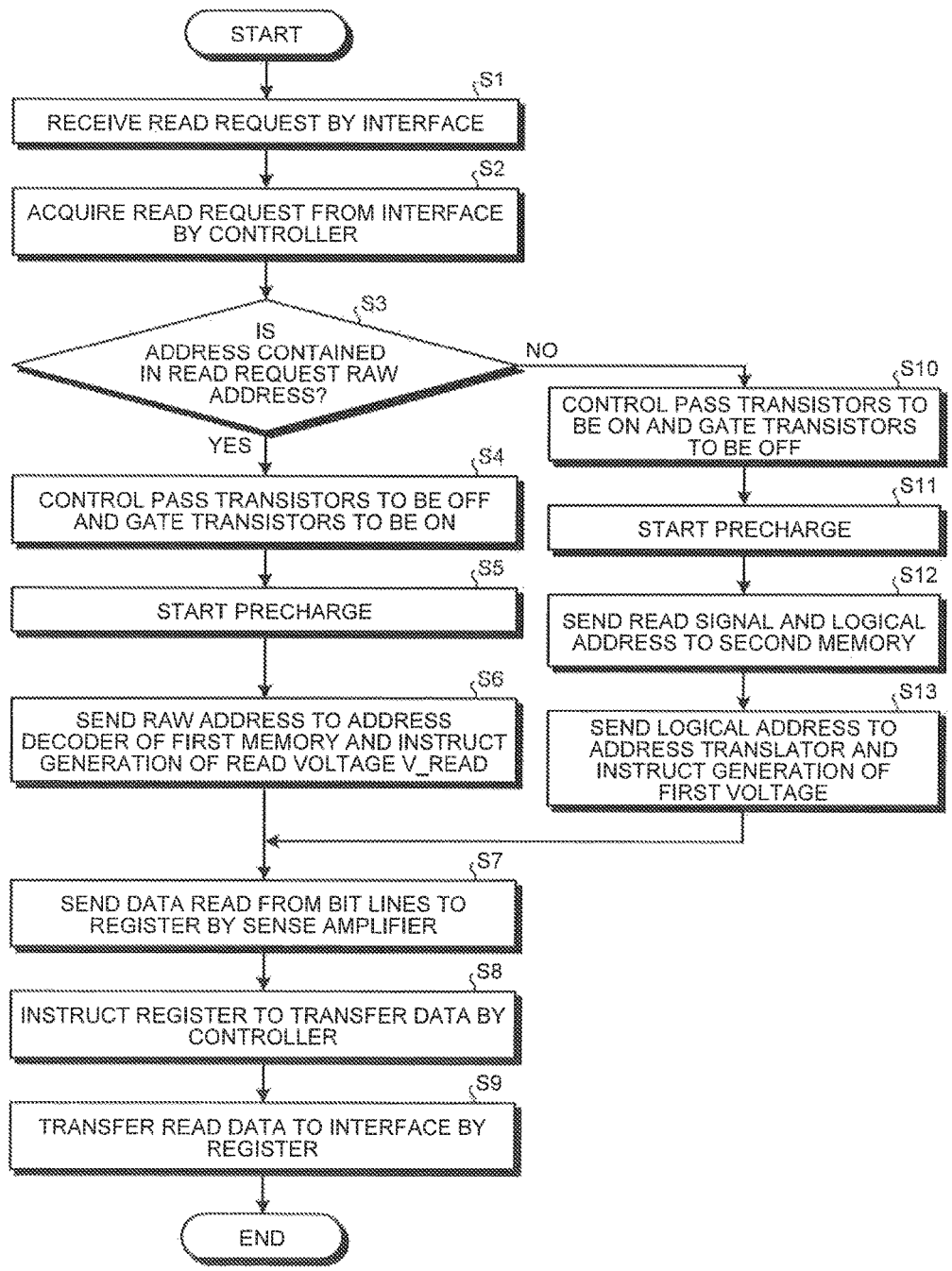
FIG. 7 is a flowchart for explaining operation of reading data from the first memory provided in the memory system according to the embodiment.

Next, operation of reading data from the first memory 100 will be described with reference to FIG. 7. FIG. 7 is a flowchart illustrating an example of operation of reading data from the first memory 100. As illustrated in FIG. 7, the interface 10 first receives a read request from a host device outside of the memory system (step S1). The interface 10 may be configured to send an electric signal to the controller 20 to inform the controller 20 of reception of a read request from the host device, or may be configured to update a value of a register from and to which the controller 20 directly reads and writes data. In the configuration in which the interface 10 updates a value of a register, when the interface 10 updates the value of the register, the controller 20 monitoring the register detects the change in the value of the register.

Subsequently, the controller 20 acquires the read request from the interface 10 (step S2), and stores an address contained in the read request into an internal memory of the controller 20. Subsequently, the controller 20 determines whether or not the address contained in the read request is a RAW address (a physical address capable of identifying a page, that is, a word line WL of the first memory 100) (step S3). Since a read request in such a form as READ (#address, determination bit, . . . ), for example, the determination can be made in such a manner that the address is a RAW address if the determination bit indicates "0" or a logical address if the determination bit indicates "1," for example. Alternatively, #address contained in the read request may be in 32 bits, and the determination can be made in such a manner that the address is a PAW address if the uppermost bit is 0 or a logical address if the uppermost bit is 1.

If the address is determined to be a RAW address in step S3 described above (step S3: Yes), the controller 20 controls each of the pass transistors Tps to be in the OFF state and controls each of the gate transistors Tgs to be in the ON state (step S4). Subsequently, the controller 20 starts the precharge described above, and controls the selection gates of NAND strings MS to be in the ON state (step S5).

Subsequently, the controller 20 sends the RAW address to the address decoder 102 of the first memory 100, and instructs the voltage generation circuit, which is not illustrated, to generate read voltage V_READ (step S6). In this manner, "0" or "1" can be read as a value indicating the memory state (threshold state) of each of the first memory cells (FG-MOSFETs) arranged at positions corresponding to intersections of the word line WL indicated by the RAW address and multiple bit lines BL. Note that the order of steps S4 to S6 described above is an example and is not limited thereto.

Subsequently, the sense amplifier 104 of the first memory 100 sends data read from the bit lines BL to the register 105 (step 37). At the point when the data is held by the register 105, a signal is transmitted from the register 105 to the controller 20, and the controller 20 instructs the register 105 to transfer the data (step S3). The register 105 then transfers the read data to the interface 10 via the data bus 300 (step S9).

If the address is determined not to be a RAW address, that is, the address is determined to be a logical address in step S3 described above (step S3: No), the controller 20 first controls each of the pass transistors Tps to be in the ON state and controls each of the gate transistors Tgs to be in the OFF state (step S10). Subsequently, the controller 20 starts the precharge described above, and controls the selection gates of NAND strings MS to be in the ON state (step S11). Subsequently, the controller 20 sends a read signal instructing to read data and the logical address contained in the read request to the second memory 200 (step S12).

The control unit 202 of the second memory 200 receives the set of the read signal and the logical address from the controller 20 via the control signal line 120. The control unit 202 then sends the logical address received from the controller 20 to the address translation unit 203, and instructs the voltage generation circuit, which is not illustrated, to generate the first voltage described above (step S13).

In this manner, the first voltage generated by the voltage generation circuit, which is not illustrated, is supplied to the bit line BX (the bit line BX associated in advance with the specified logical address) selected by the address translation unit 203. An electric signal according to the first voltage is then transmitted to a word line WL in the first memory 100 via the word line WX connected to the second memory cell set in the low resistive state in advance according to the associations between the logical addresses and the word lines WL of the first memory 100 among the second memory cells connected to the bit line BX.

As a result, the read voltage V_READ is applied to the word line WL, and "0" or "1" can be read as a value indicating the memory state (threshold state) of each of the first memory cells (FG-MOSFETs) arranged at positions corresponding to intersections of the word line WL and the bit lines BL. After the process in step S13, the processes in step S7 and subsequent steps are performed. Note that the order of steps S10 to S13 described above is an example and is not limited thereto.

Figure 8:
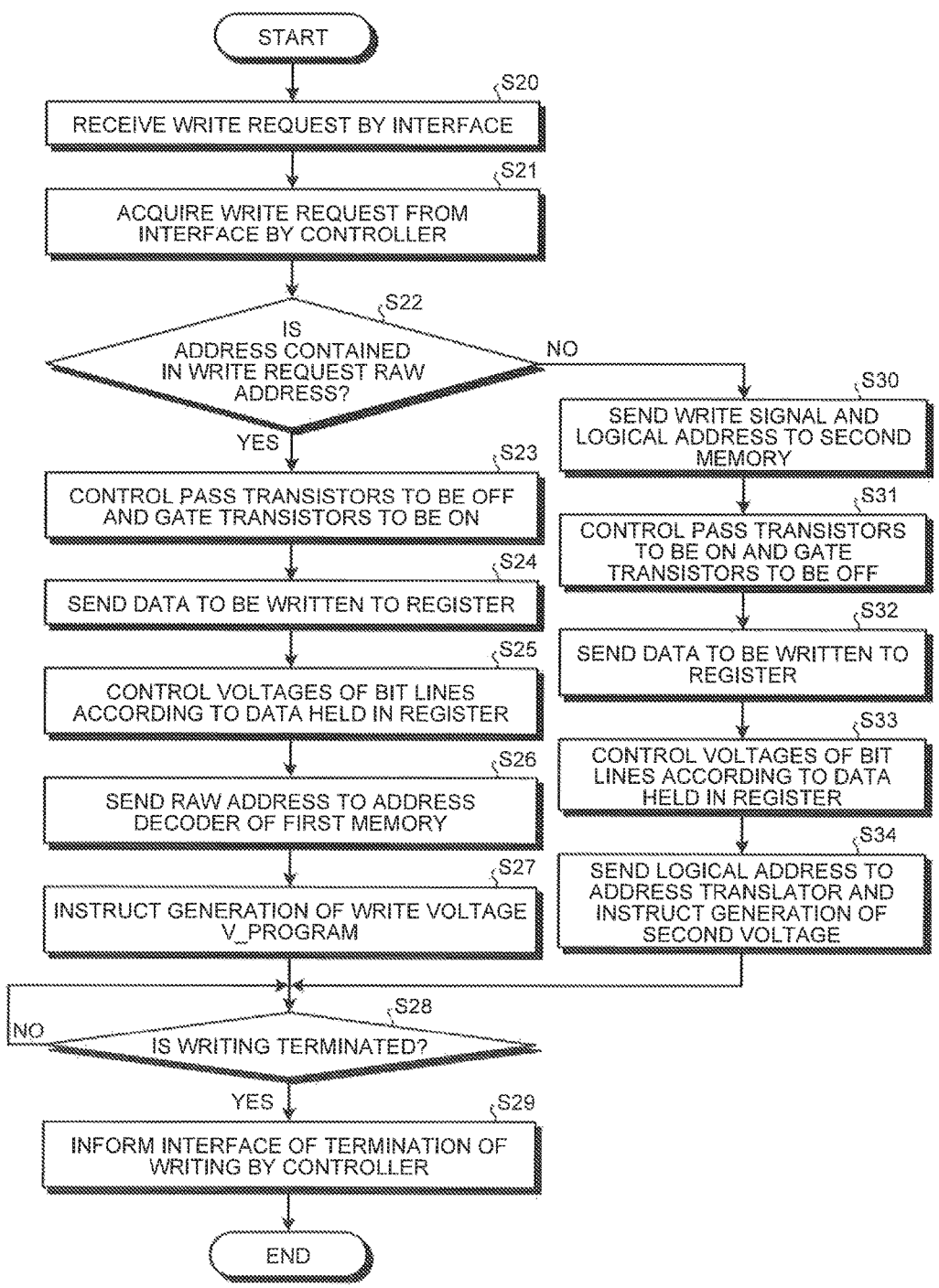
FIG. 8 is a flowchart for explaining operation of writing data into the first memory provided in the memory system according to the embodiment.

Next, operation of writing data into the first memory 100 will be described. FIG. 8 is a flowchart illustrating an example of operation of writing data into the first memory 100. In the flowchart illustrated in FIG. 8, the interface 10 first receives a write request from the host device (step S20). The interface 10 may be configured to send an electric signal to the controller 20 to inform the controller 20 of reception of a write request from the host device, or may be configured to update a value of the register 105 from and to which the controller 20 directly reads and writes data.

Subsequently, the controller 20 acquires the write request from the interface 10 (step S21), and stores an address contained in the write request into the internal memory of the controller 20. The controller 20 also temporarily buffers data contained in the write request (data requested to be written) in another memory managed by the controller 20 or transfers the data to the register 105 of the first memory 100.

Subsequently, the controller 20 determines whether or not an address contained in the write request is a RAW address (step S22). Since a write request is in such a form as WRITE (#address, determination bit, . . . , data or data location address), the address can be determined to be a RAW address if the determination bit indicates "0" or a logical address if the determination bit indicates "1," for example. Alternatively, #address contained in the write request may be in 32 bits, and the address can be determined to be a RAW address if the uppermost bit is 0 or a logical address if the uppermost bit is 1.

If the address is determined to be a PAW address in step S22 described above (step S22: Yes), the controller 20 controls each of the pass transistors Tps to be in the OFF state and controls each of the gate transistors Tgs to be in the ON state (step S23). Subsequently, the controller 20 sends the data (the data to be written) contained in the write request to the register 105 (step S24). Subsequently, the controller 20 performs control to supply a voltage (0 V, for example) for selection to the bit line BL into which data are to be written and supply a voltage (power supply voltage Vdd, for example) for non-selection to a bit line BL into which data are not to be written according to the data held in the register 105 (step S25). The controller 20 also controls the selection gates of NAND strings MS to be in the ON state.

Subsequently, the controller 20 sends an address signal indicating the RAW address to the address decoder 102 of the first memory 100 (step S26). Subsequently, the controller 20 instructs the voltage generation circuit, which is not illustrated, to generate write voltage V_PROGRAM (step S27). As a result, the write voltage V_PROGRAM generated by the voltage generation circuit, which is not illustrated, is supplied to the word line WL selected by the address decoder.

In this manner, the first memory cell into which the data are to be written (the first memory cell at the position corresponding to the intersection of the word line WL to which the write voltage V_PROGRAM is supplied and the bit line BL to which the voltage for selection is supplied) can be changed to a state in which "0" is written therein. Note that the order of steps S23 to S27 described above is an example and is not limited thereto.

An internal logic circuit of the register 105 checks (verifies) whether or not data have been written successfully, and a signal is transmitted to the controller 20 at the point when writing is terminated (step S28: Yes). The controller 20 that has detected the termination of writing informs the interface 10 of the termination of writing (step S29).

If the address is determine not to be a RAW address, that is, the address is determined to be a logical address in step S22 described above (step S22: No), the controller 20 first sends a write signal indicating to write data and the logical address contained in the write request to the second memory 200 (step S30). Subsequently, the controller 20 controls each of the pass transistors Tps to be in the ON state and controls each of the gate transistors Tgs to be in the OFF state (step S31). Subsequently, the controller 20 sends the data to be written contained in the write request to the register 105 (step S32).

Subsequently, the controller 20 performs control to supply a voltage (0 V, for example) for selection to the bit line BL into which data are to be written and supply a voltage (power supply voltage Vdd, for example) for non-selection to a bit line BL into which data are not to be written according to the data held in the register 105 (step S33). The controller 20 also controls the selection gates of NAND strings MS to be in the ON state.

The control unit 202 of the second memory 200 receives the set of the write signal and the logical address from the controller 20 via the control signal line 120. The control unit 202 then sends the logical address received from the controller 20 to the address translation unit 203, and instructs the voltage generation circuit, which is not illustrated, to generate the second voltage described above (step S34).

In this manner, the second voltage generated by the voltage generation circuit, which is not illustrated, is supplied to the bit line BX (the bit line BX associated in advance with the specified logical address) selected by the address translation unit 203. An electric signal according to the second voltage is then transmitted to a word line WL in the first memory 100 via the word line WX connected to the second memory cell set in the low resistive state in advance according to the associations between the logical addresses and the word lines WL among the second memory cells connected to the bit line BX. As a result, the write voltage V_PROGRAM is applied to this word line WL, and the first memory cell into which the data are to be written located at the position corresponding to the intersection of this word line WL and the bit line BL to which the voltage for selection is supplied can be changed to a state in which "0" is written therein. After the process in step S34, the processes in step S28 and subsequent steps are performed. Note that the order of steps S30 to S34 described above is an example and is not limited thereto.

As described above, the memory system according to the embodiment includes the first memory 100 including multiple first memory cells arranged in a matrix, the positions of the first memory cells corresponding to the intersections of multiple word lines WL and multiple bit lines BL. The memory system also includes the second memory 200 including multiple second memory cells arranged in a matrix, the positions of the second memory cells corresponding to the intersections between multiple word lines WX each connected to one of the word lines WL and multiple bit lines BX each associated in advance with a logical address to be specified by the host device. The resistive state of each of the second memory cells included in the second memory 200 is set to the high resistive state or the low resistive state according to the association between the logical address and a word line WL of the first memory 100.

In reading data based on a logical address specified by the host device, for example, the control unit 202 of the second memory 200 performs control to supply the first voltage described above to the bit line BX associated in advance with the specified logical address. As a result, the read voltage V_READ can be applied to the word line WL (the word line WL associated with the specified logical address) of the first memory 100 associated with the second memory cell in the low resistive state connected to the bit line BX.

Specifically, since the memory system according to the embodiment can select the word line WL of the first memory 100 associated with the specified logical address and supply the read voltage V_READ at the same time without performing a process of reading an L2P table held as data, a process of referring to the read L2P table to search for a physical address associated with the logical address, and the like, the processing speed in reading data can be improved. In the case of a MRAM or a ReRAM, for example, a typical reading speed is 30 ns. If the design does not involve a RAM, the reading speed can be further increased.

Furthermore, in writing data based on a logical address specified by the host device, for example, the control unit 202 of the second memory 200 performs control to supply the second voltage described above to the bit line BX associated in advance with the specified logical address. As a result, the write voltage V_PROGRAM can be applied to the word line WL (the word line WL associated with the specified logical address) of the first memory 100 associated with the second memory cell in the low resistive state connected to the bit line BX.

Specifically, the memory system according to the embodiment can select the word line WL of the first memory 100 associated with the specified logical address and supply the write voltage V_PROGRAM at the same time without performing a process of reading an L2P table held as data, a process of referring to the read L2P table to search for a physical address associated with the logical address, and the like. The processing speed in writing data can thus be improved. In the case of a MRAM or a ReRAM, for example, a typical writing speed is 30 ns. If the design does not involve a RAM, the writing speed can be further increased.

Specifically, the memory system according to the embodiment has a configuration in which the word lines WX of the second memory 200 are directly connected with the word lines WL of the first memory 100 and in which the resistive state of each of the second memory cells included in the second memory 200 is set at least to the high resistive state or the low resistive state according to the association between the logical address and the word line WL. As a result, the processing speed in reading or writing data can be significantly improved.

Figure 9:
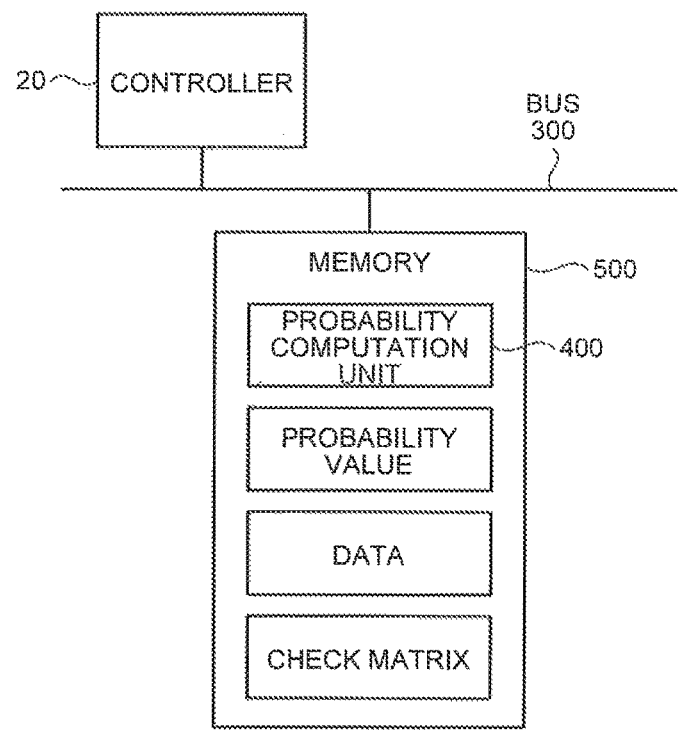
FIG. 9 is a block diagram of a main part that implements an error correcting function in the memory system according to the embodiment.

In addition, the memory system according to the embodiment optimizes operation of each memory by an error correcting function, which will be described below, to effectively extend the lifetime of the memories, so as to improve the reliability as a system. This error correcting function includes the controller 20, a probability computation unit 400, and a memory 500 as illustrated in FIG. 9. The controller 20 and the memory 500 are connected to each other via the data bus 300. In addition, the probability computation unit 400 that performs probability computation, which will be described later, is provided in the memory 500. The probability computation unit 400 is an example of a computation unit. A probability value calculated in a probability computation process, which will be described later, is stored in the memory 500. Furthermore, the memory 500 has stored therein large quantities of data, which will be described later, and multiple check matrices.

The memory 500 has a large capacity, and constituted by a NAND flash memory, for example. The entire memory area of the memory 500 is divided into a first memory area and a second memory area, and the probability computation unit 400 is provided in the second memory area. As will be described later, in the memory system, data are saved in the first memory area, and the probability computation unit 400 provided in the second memory area performs the probability computation process using data read from the first memory area. The controller 20 performs control to transfer data between the first and second memory areas. The data transfer between the first and second memory areas is carried out via the data bus 300. The first memory area also saves results of computation in the probability computation process.

Specifically, parameters generated by data sequences such as reading data from and writing data into the memory 500 are saved in a form of probability values in the first memory area. The probability computation unit 400 processes the saved probability values into small data that are easily handled as probability statistical values. The controller 20 performs operation of the first memory area on the basis of the processed data.

Figure 10:
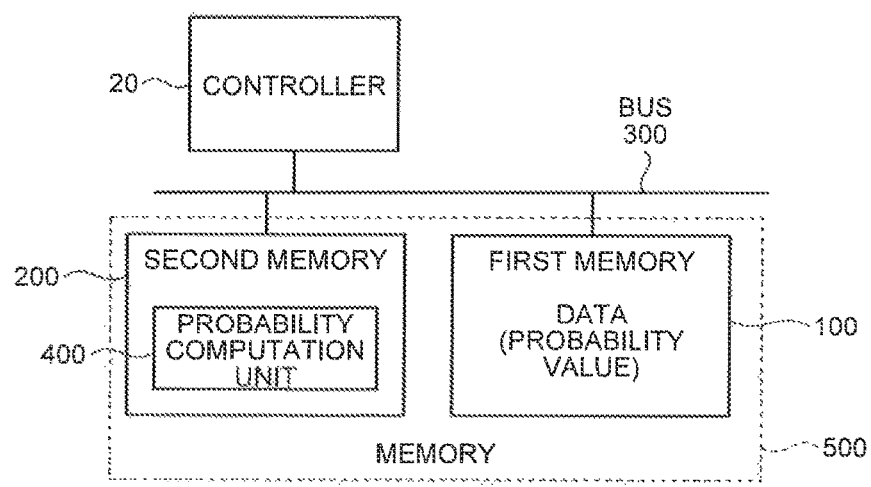
FIG. 10 is a block diagram for explaining another configuration that implements the error correcting function in the memory system according to the embodiment.

Note that the system configuration may be other than the example illustrated in FIG. 9. For example, FIG. 10 illustrates an example in which the memory 500 is divided into a first memory 100 and a second memory 200 that are physically separate from each other and in which the probability computation unit 400 is provided in the second memory 200. The first memory 100 is constituted by a NAND flash memory, for example, having a large memory capacity. The second memory 200 is a memory having a smaller memory capacity than the first memory 100, but having excellent random accessibility allowing data to be read/written therefrom/thereto at a higher speed. For the second memory 200, a volatile memory such as a DRAM or a SRAM can be used, for example. Alternatively, for the second memory 200, a nonvolatile memory-such as a MRAM, a ReRAM, a PCRAM, or a FeRAM can be used, for example.

Large quantities of data are saved in the first memory 100. The controller 20 transfers data read from the first memory 100 to the second memory 200. The probability computation unit 400 provided in the second memory 200 performs the probability computation process, which will be described later, using the transferred data.

Figure 11:
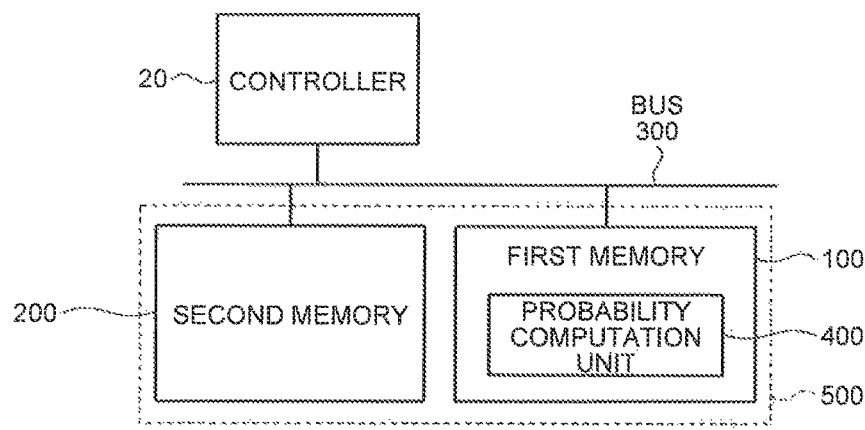
FIG. 11 is a block diagram for explaining another configuration that implements the error correcting function in the memory system according to the embodiment.

Furthermore, FIG. 11 illustrates an example in which the memory 500 is divided into a first memory 100 and a second memory 200 that are physically separate from each other and in which the probability computation unit 400 is provided in the first memory 100.

Figure 12:
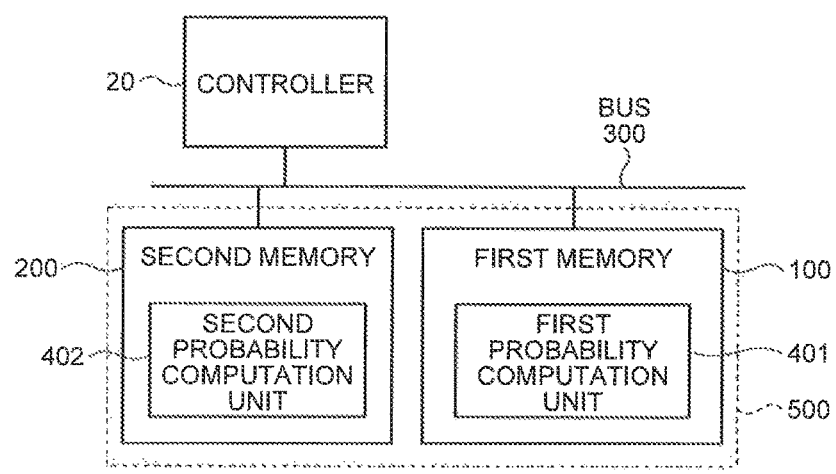
FIG. 12 is a block diagram for explaining another configuration that implements the error correcting function in the memory system according to the embodiment.

Furthermore, FIG. 12 illustrates an example in which the memory 500 is divided into a first memory 300 and a second memory 200 that are physically separate from each other and in which the probability computation unit 400 is also divided into a first probability computation unit 401 and a second probability computation unit 402. In the example illustrated in FIG. 12, the first probability computation unit 401 is provided in the first memory 100 and the second probability computation unit 402 is provided in the second memory 200.

In FIG. 12, large quantities of data are saved in the first memory 100. The controller 20 may perform part of probability computation at the first probability computation unit 401 in the first memory 100, then transfer the resulting data to the second probability computation unit 402 in the second memory 200, and perform subsequent probability computation at the second probability computation unit 402. Alternatively, the controller 20 may control the first probability computation unit 401 and the second probability computation unit 402 to perform probability computations for calculation purposes different from each other at the same time.

Figure 13:
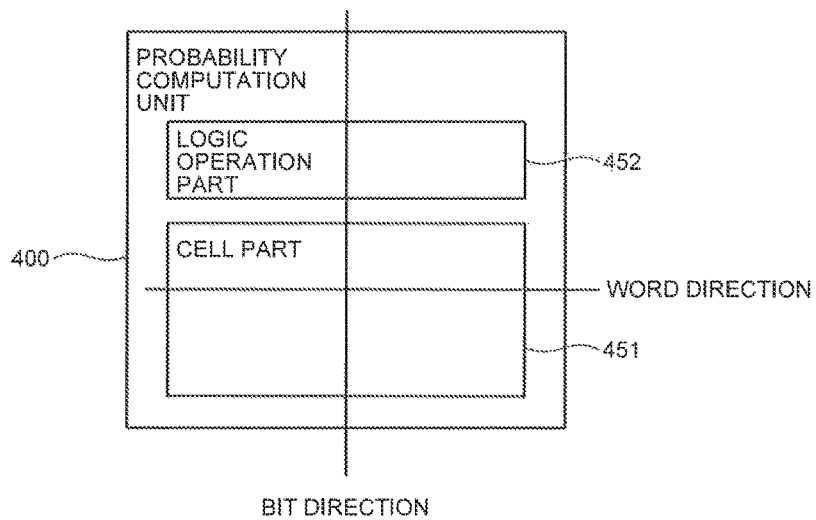
FIG. 13 is a block diagram of a probability computation unit provided in a memory of the memory system according to the embodiment.

Next, FIG. 13 illustrates a configuration of the probability computation unit 400. As illustrated in FIG. 13, the probability computation unit 400 includes a cell part 451 that performs probability computation, and a logic operation part 452 that performs logic operation. The logic operation part 452 processes computation of probability values in addition to so-called logic operations such as AND, OR, NOT and XOR. The logic operation part 452 can also compare the magnitudes of probability values. The logic operation part 452 may be constituted by a digital circuit or may be constituted by an analog circuit. The logic operation part 452 constituted by an analog circuit can increase the speed of computation.

The cell part 451 stores probability values for the probability computation process and performs probability computation. Thus, the cell part 451 also includes circuits and selection transistors for supplying voltage and current and for reading a voltage value and a current value.

Figure 14:
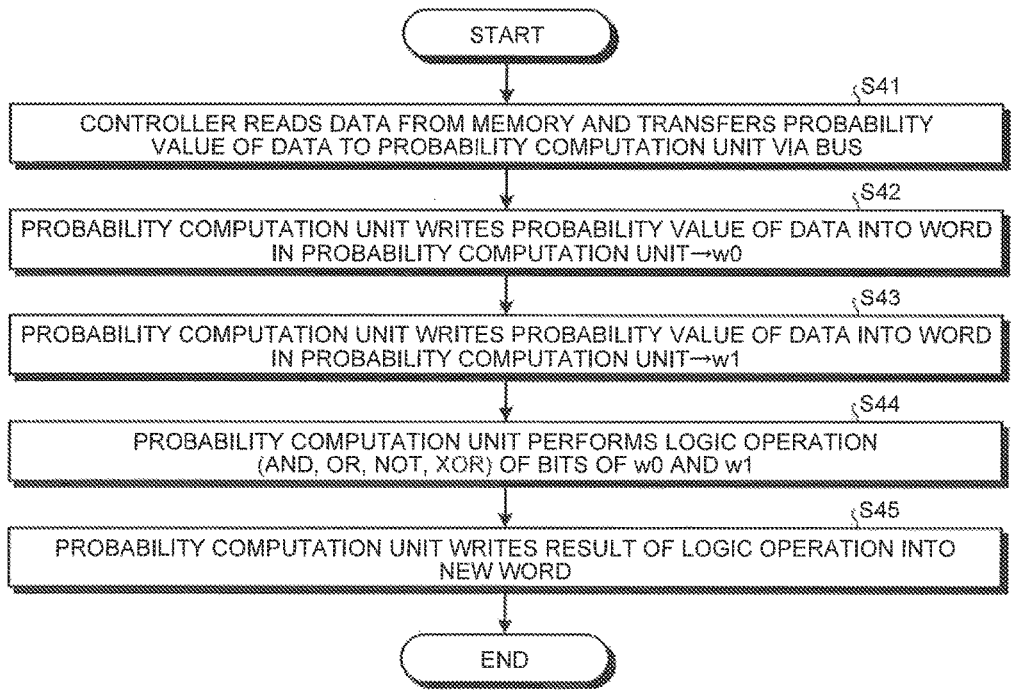
FIG. 14 is a flowchart for explaining procedures of a probability computation process in the memory system according to the embodiment.

Next, the probability computation process at the probability computation unit 400 will be described. A flowchart of FIG. 14 illustrates procedures of the probability computation process. In the flowchart of FIG. 14, in step S41, the controller 20 reads data from the memory 500 and transfers a probability value of the data to the probability computation unit 400 via the data bus 300. For example, in the example of FIG. 10, the memory 500 is divided into the first memory 100 and the second memory 200 and the probability computation unit 400 is provided in the second memory 200. In this case, the controller 20 transfers a probability value read from the first memory 100 to the probability computation unit 400 in the second memory 200.

In step S42, the probability computation unit 400 writes the probability value read from the first memory 100 into a word (w0) on the zeroth row of the cell part 451 illustrated in FIG. 13. In step S43, the probability computation unit 400 writes the probability value read from the first memory 100 into a word (w1) on the first row of the cell part 451 illustrated in FIG. 13.

Subsequently, in step S44, the logic operation part 452 of the probability computation unit 400 performs logic operation (AND, OR, NOT, XOR) of bits of the probability value written in the word (w0) on the zeroth row of the cell part 451 and the probability value written in the word (w1) on the first row of the cell part 451. In step S45, the cell part 451 of the probability computation unit 400 then writes a result of the logic operation into a new word, and the process of the flowchart of FIG. 14 is terminated.

Figure 15:
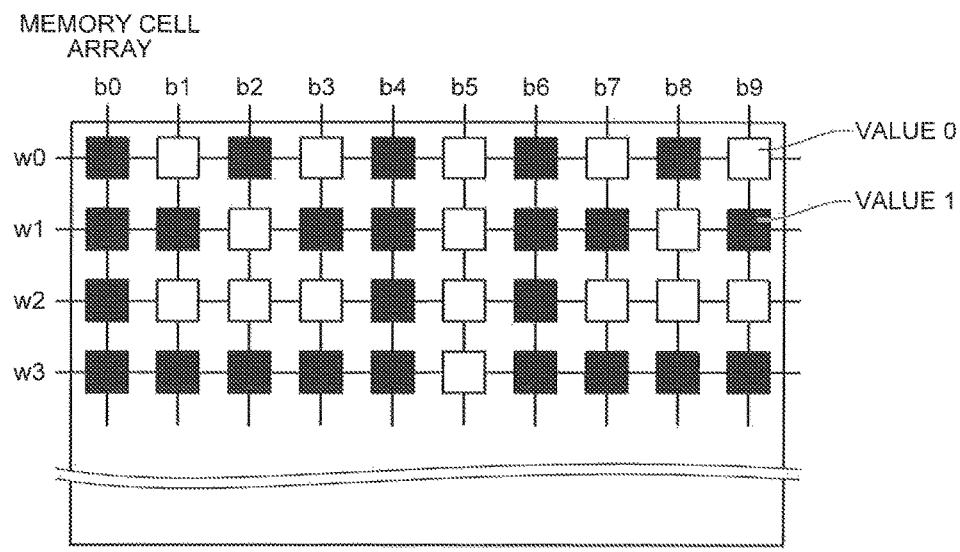
FIG. 15 is a diagram for explaining a digital probability computation process in the memory system according to the embodiment.

Such a probability computation process will be described in detail. First, in the cell part 451 of the probability computation unit 400, memory cells are arranged in a bit direction and in a word direction as illustrated in FIG. 13 (memory cell array). An example illustrated in FIG. 15 is an example of 10 bits in total including memory cells of bits b0 to b9. Furthermore, the example illustrated in FIG. 15 is an example in which the logic operation part 452 of the probability computation unit 400 is constituted by a digital circuit and each memory cell has information of 0 or 1. In FIG. 15, when a probability value read from the first memory 100 and transferred to the probability computation unit 400 is written into memory cells, the states of the memory cells are determined randomly (step S42, step S43). In FIG. 15, memory cells represented by white squares indicate "0." Memory cells represented by black squares indicate "1."

In the case of the word w0 on the zeroth row, five black squares are present in the word direction. This indicates a probability value 5/10. This probability value of the word w0 on the zeroth row is represented by "P1." Similarly, in the word w1 on the first row, seven black squares are present in the word direction. This indicates a probability value 7/10. This probability value of the word w1 on the first row is represented by "P2."

The logic operation part 452 writes results of AND operations of bits b0 to b9 of the word w0 and the word w1 into a word w2 on the second row (step S44 and step S45). Specifically, when the bit b0 of the word w0 is 1 (black) and the bit b0 of the word w1 is 1 (black), the logic operation part 452 performs AND operation of the bits and writes 1 (black) that is the AND operation result into the bit b0 of the word w2. Similarly, when the bit b1 of the word w0 is 0 (white) and the bit b1 of the word w1 is 1 (black), the logic operation part 452 performs AND operation of the bits and writes 0 (white) that is the AND operation result into the bit b1 of the word w2. Similarly, when the bit b2 of the word w0 is 1 (black) and the bit b2 of the word w1 is 0 (white), the logic operation part 452 performs AND operation of the bits and writes 0 (white) that is the AND operation result into the bit b2 of the word w2. Similarly, when the bit b5 of the word w0 is 0 (white) and the bit b5 of the word w1 is 0 (white), the logic operation part 452 performs AND operation of the bits and writes 0 (white) that is the AND operation result into the bit b5 of the word w2.

When the bits b0 to b9 of the word w2 in which the AND operation results are saved in this manner is viewed along the word direction, 1 (black) is written in each of the bit b0, the bit b4, and the bit b6. Thus, three values of 1 (black) in total are written in the word w2. The word w2 having three values of 1 (black) in total indicates a probability value 3/10. The probability value of the word w2 on the second row is represented by "P3."

The probability value P1×the probability value P2 is "(5/10)×(7/10)," which equals 35/100, which is approximately a value of 3/10. In the meantime, the probability value P3 of the word w2 in which the AND operation results are written is 3/10. Thus, an approximate value of the computation result of the probability value P1×the probability value P2 can be written into the bits b0 to b9 of the word w2 by performing the AND operations described above.

Subsequently, the logic operation part 452 writes results of OR operations of the bits b0 to b9 of the word w0 and the word w1 into a word w3 on the third row. Specifically, when the bit b0 of the word w0 is 1 (black) and the bit b0 of the word w1 is 1 (black), the logic operation part 452 performs OR operation of the bits and writes 1 (black) that is the OR operation result into the bit b0 of the word w3. Similarly, when the bit b1 of the word w0 is 0 (white) and the bit b1 of the word w1 is 1 (black), the logic operation part 452 performs OR operation of the bits and writes 1 (black) that is the OR operation result into the bit b1 of the word w3. Similarly, when the bit b2 of the word w0 is 1 (black) and the bit b2 of the word w1 is 0 (white), the logic operation part 452 performs OR operation of the bits and writes 1 (black) that is the OR operation result into the bit b2 of the word w3. Similarly, when the bit b5 of the word w0 is 0 (white) and the bit b5 of the word w1 is 0 (white), the logic operation part 452 performs OR operation of the bits and writes 0 (white) that is the OR operation result into the bit b5 of the word w3.

When the bits b0 to b9 of the word w3 in which the OR operation results are saved in this manner is viewed along the word direction, 1 (black) is written in all of the bits except for the bit b5. Thus, nine values of 1 (black) in total are written in the word w3. The word w3 having nine values of 1 (black) in total indicates a probability value 9/1.0. The probability value of the word w3 on the third row is represented by "P4."

The probability value P1+the probability value P2 is "(5/10)+(7/10)," which equals 12/10, which is a value exceeding the value "1." In the meantime, the probability value P4 of the word w3 in which the OR operation results are written is 9/10. Thus, an approximate value of the computation result of the probability value P1+the probability value P2 can be written into the bits b0 to b9 of the word w3 by performing the OR operations described above.

Figure 16:
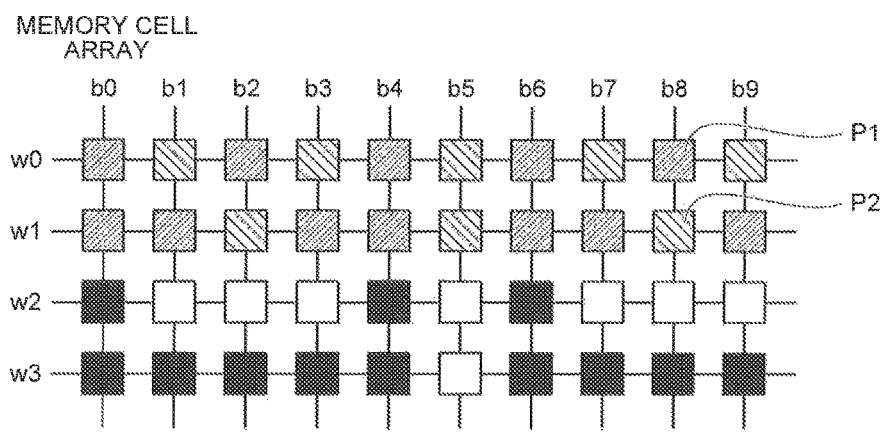
FIG. 16 is a diagram for explaining an analog probability computation process in the memory system according to the embodiment.

Next, an example illustrated in FIG. 16 is an example in which the logic operation part 452 of the probability computation unit 400 is constituted by an analog circuit. In this case, each of the memory cells has information between 0 to 1. For example, a square with leftward hatching illustrated in FIG. 16 represents a probability value of 0.5 or larger and a square with rightward hatching represents a probability value smaller than 0.5, for example.

AND operations and OR operations are similar to those described above. Specifically, AND operations of the probability values of the bits of the word w0 and the probability values of the bits of the word w1 are performed, and the AND operation results are written into the bits of the word w2. More specifically, when an AND operation result is 0.5 or larger, an AND operation result of 1 (black) is written into a bit of the word w2, and when the value is smaller than 0.5, an AND operation result of 0 (white) is written into a bit of the word w2.

Furthermore, OR operations of the probability values of the bits of the word w0 and the probability values of the bits of the word w1 are performed, and the OR operation results are written into the bits of the word w3. Specifically, when an OR operation result is 0.5 or larger, an OR operation result of 1 (black) is written into a bit of the word w3, and when the value is smaller than 0.5, an OR operation result of 0 (white) is written into a bit of the word w3.

As can be seen from comparison between the word w2 and the word w3 in FIG. 15 and the word w2 and the word w3 in FIG. 16, the operation results when the logic operation part 452 of the probability computation unit 400 is constituted by an analog circuit are the same as those when the logic operation part 452 is constituted by a digital circuit. Thus, "P3" that is a probability value in the word w2 is an approximate value of P1/P2. In addition, "P4" that is a probability value in the word w3 is an approximate value of P1+P2.

Figure 17:
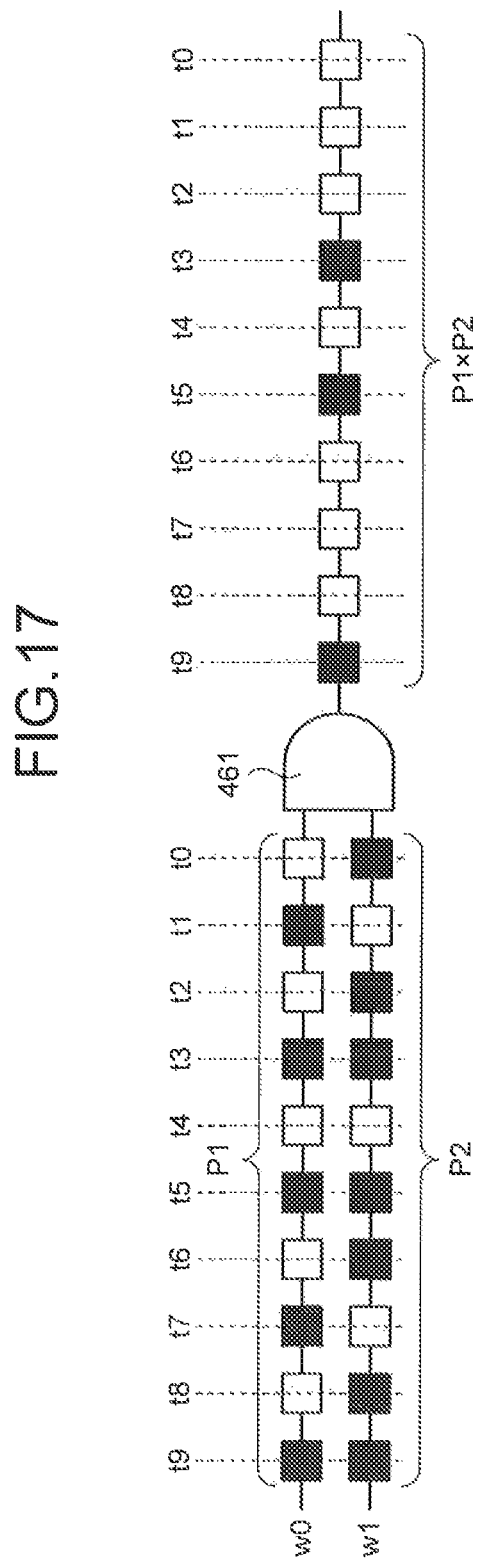
FIG. 17 is a diagram for explaining a probability computation process performed by an AND gate of the memory system according to the embodiment.

Next, a logic operation process of the logic operation part 452 of the probability computation unit 400 will be described in detail. FIG. 17 is a schematic diagram of the AND operation process described above. A word line of w0 and a word line of w1 are connected to an AND gate 461 of the logic operation part 452. The probability value of the bit b9 of the word line of w0 and the probability value of the bit b9 of the word line of w1 are supplied to the AND gate 461 at a timing of time t0. Similarly, the probability value of the bit b8 of the word line of w0 and the probability value of the bit b8 of the word line of w1 are supplied to the AND gate 461 at a timing of time t1. Similarly, the probability value of the bit b7 of the word line of w0 and the probability value of the bit b7 of the word line of w1 are supplied to the AND gate 461 at a timing of time t2. In this manner, the probability values (P1, P2) of each of the bits of the word line of w0 and the word line of w1 are supplied to the AND gate 461 at each of times t0 to t9. The AND gate 461 performs a process of multiplying the probability values of each of the bits of the word lines supplied at each of the times t0 to t9 (P1×P2) to generate an AND operation result at each of the times t0 to t9.

Figure 18:
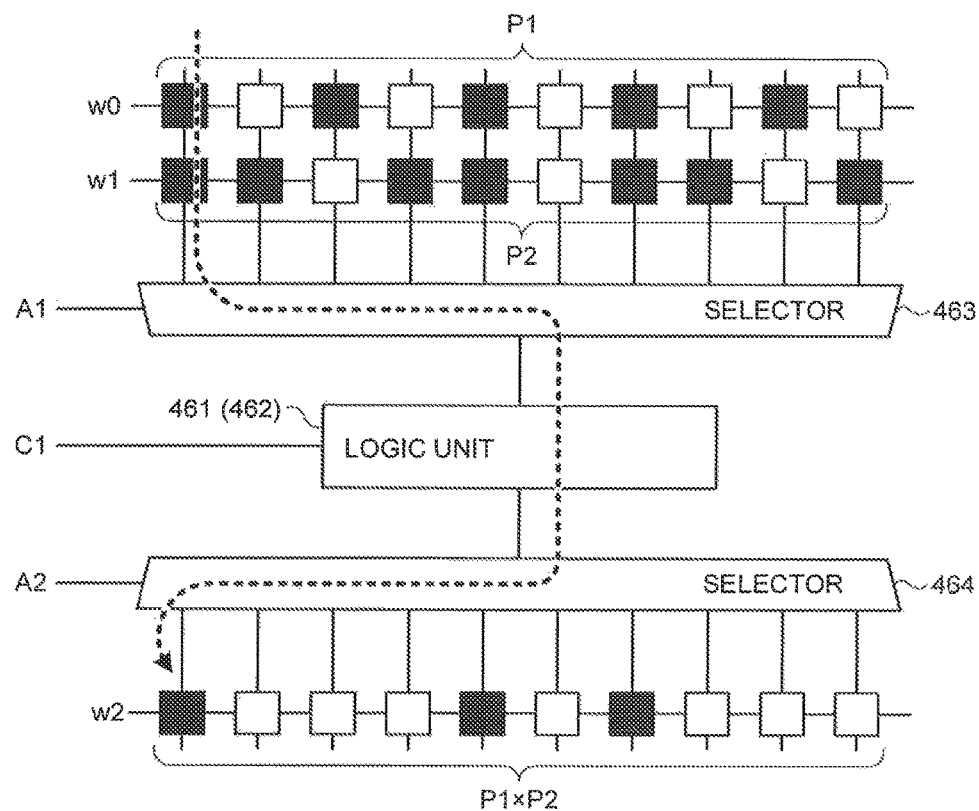
FIG. 18 is a diagram for explaining a flow of data in a probability computation process in the memory system according to the embodiment.

More specifically, the logic operation part 452 of the probability computation unit 400 selects the probability values of the bits b0 to b9 of the word line of w0 and the word line of w1 by a selector 463 illustrated in FIG. 18 at the timing of the times t0 to t9, and supplies the selected values to the AND gate 461. The results of AND operations of the AND gate 461 are selected by a selector 464 and written into the word line of w2.

Figure 19:
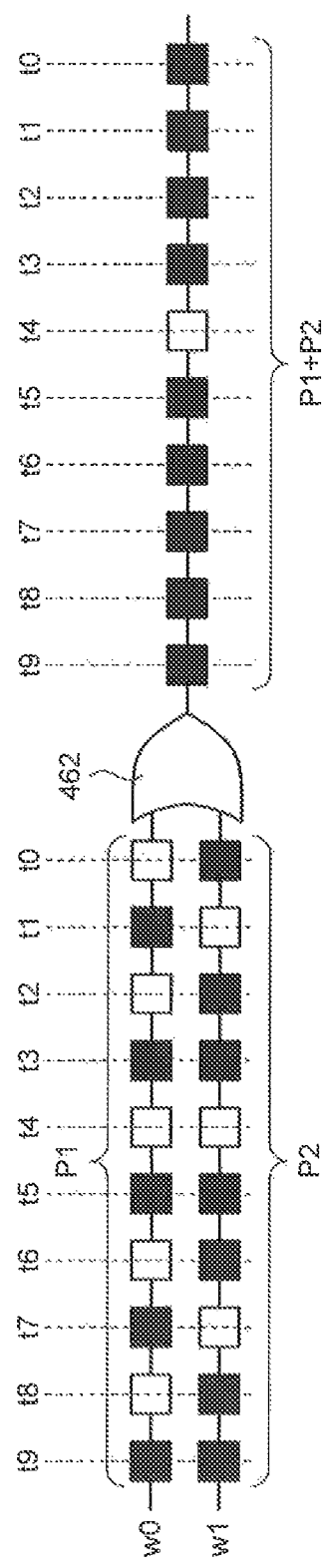
FIG. 19 is a diagram for explaining a probability computation process performed by an OR gate of the memory system according to the embodiment.

The same applies to an OR operation process. FIG. 19 is a schematic diagram of the OR operation process. The word line of w0 and the word line of w1 are connected to an OR gate 462 of the logic operation part 452. The probability value of the bit b9 of the word line of w0 and the probability value of the bit b9 of the word line of w1 are supplied to the OR gate 462 at a timing of time t0. Similarly, the probability value of the bit b8 of the word line of w0 and the probability value of the bit b8 of the word line of w1 are supplied to the OR gate 462 at a timing of time t1. Similarly, the probability value of the bit b7 of the word line of w0 and the probability value of the bit b7 of the word line of w1 are supplied to the OR gate 462 at a timing of time t2. In this manner, the probability values (P1, P2) of each of the bits of the word line of w0 and the word line of w1 are supplied to the OR gate 462 at each of times t0 to t9. The OR gate 462 performs a process of adding the probability values of each of the bits of the word lines supplied at each of the times t0 to t9 (P1+P2) to generate an OR operation result at each of the times t0 to t9.

More specifically, the logic operation part 452 of the probability computation unit 400 selects the probability values of the bits b0 to b9 of the word line of w0 and the word line of w1 by the selector 463 illustrated in FIG. 18 at the timing of the times t0 to t9, and supplies the selected values to the OR gate 462. The results of OR operations of the OP gate 462 are selected by the selector 464 and written into corresponding bits of the word line of w3.

Subsequently, for writing data into the memory cells, a voltage that rewrites the values of the memory cells or higher is typically supplied to the transistors. In contrast, in the case of the memory system according to the embodiment, an intermediate voltage that may rewrite or may not rewrite the values of the memory cells is supplied to the transistors by design. Specifically, in a case where a voltage of 1.5 V is to be supplied to the transistors for rewriting, for example, if a voltage of only 1.0 V is supplied to the transistors, the values of the memory cells are rewritten only with a probability of about 50 percent. Conversely, the values of some memory cells may be rewritten even though a low voltage that is not intended to rewrite the values is supplied to the transistors. The memory system according to the embodiment adjusts the write voltage to be supplied to the memory cells so that the error rate will be a desired rate.

Specifically, as described above, in writing data, write voltage V_PROGRAM is supplied to the word lines WL illustrated in FIG. 3 to change the thresholds of the memory cells (FG-MOSFETs). The memory system according to the embodiment adjusts the write voltage V_PROGRAM, that is, the values of the probability value to be supplied as the thresholds described above to the memory cells so that the rate will be a desired rate.

Figure 20:
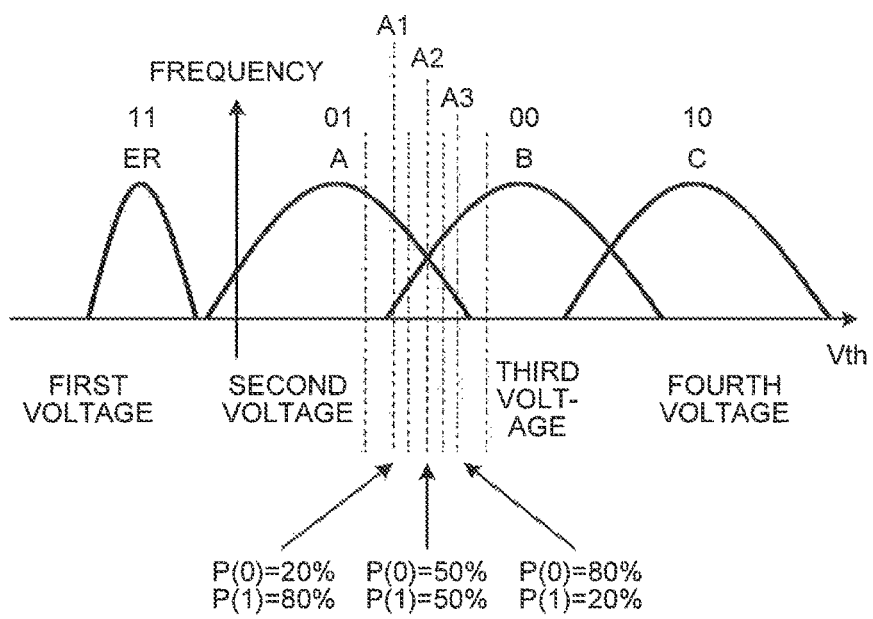
FIG. 20 is a graph for explaining control of a probability value in the memory system according to the embodiment.

FIG. 20 is a graph illustrating the relation between the voltage (threshold Vth=probability value) to be supplied to memory cells represented by the horizontal axis and the probability (frequency) with which the values are rewritten represented by the vertical axis. In FIG. 20, a waveform designated by a reference "ER" represents a first voltage value (corresponding to data "11") to be supplied for erasing data from memory cells. A waveform designated by a reference "A" represents a second voltage value (corresponding to data "01") to be supplied for controlling writing data into memory cells at a single level. For write control memory cells at a single level, two voltage values, which are the first voltage value corresponding to data "11" and the second voltage value corresponding to data "01," are used for the write control. In FIG. 20, waveforms designated by references "B" and "C" represent a third voltage value corresponding to data "00" and a fourth voltage value corresponding to data "10," respectively, which are used in multi-valued writing into memory cells.

Broken lines on the waveform "A" in FIG. 20 represent probabilities that values are rewritten. Specifically, when a voltage of A1 level is supplied to memory cells, the values of the memory cells will be "0" with a probability of 20% and "1" with a probability of 80%. When a voltage of A2 level higher than the A1 level of the waveform is supplied to memory cells, the values of the memory cells will be "0" with a probability of 50% and "1" with a probability of 50%. When a voltage of A3 level higher than the A2 level of the waveform is supplied to memory cells, the values of the memory cells will be "0" with a probability of 80% and "1" with a probability of 20%.

Techniques for controlling such rewriting probabilities of memory cells include a first technique of controlling the pulse voltage of pulses to be supplied to memory cells, a second technique of controlling the pulse width of pulses to be supplied to memory cells, a third technique of controlling the number of pulses to be supplied to memory cells, and the like.

FIGS. 21A and 21B are graphs for explaining the first technique of controlling the pulse voltage of pulses to be supplied to memory cells. In the case of the first technique, as illustrated in the graph of FIG. 21A, the voltage value (probability value) to be supplied to memory cells is controlled by controlling the height of pulses to be supplied to the memory cells. As illustrated in the graph of FIG. 21E, when a voltage of a voltage value V2 is supplied to the memory cells, the values of the memory cells are rewritten with a probability (P2) of approximately 100%. In contrast, when a voltage of a voltage value V1 that is about 70% of V2 is supplied to the memory cells, the probability that the values of the memory cells are rewritten can be controlled to be a probability (P1) of approximately 50%.

FIGS. 22A and 22B are graphs for explaining the second technique of controlling the pulse width of pulses to be supplied to memory cells. In the case of the second technique, as illustrated in the graph of FIG. 22A, the voltage value (probability value) to be supplied to memory cells is controlled by controlling the pulse width of pulses to be supplied to the memory cells. As a result of controlling the voltage value (probability value) to be supplied to memory cells using the pulse width, the probability that the values of the memory cells are rewritten can be controlled (controlled linearly) to gradually increase as the pulse width is larger (=as the voltage value is larger) as illustrated in the graph of FIG. 22B.

Figure 23B:
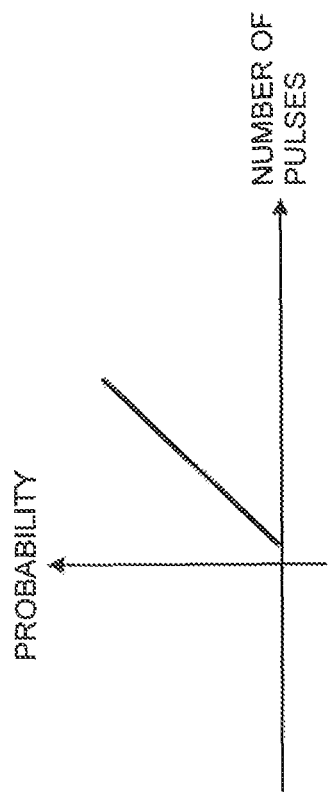
FIGS. 23A and 23B are graphs for explaining a third technique of controlling probability values in the memory system according to the embodiment.
Figure 23A:
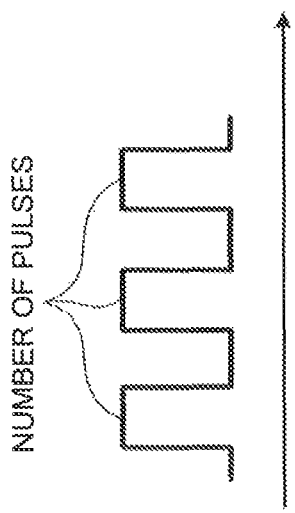

FIGS. 23A and 23B are graphs for explaining the third technique of controlling the voltage value (probability value) to be supplied to the memory cells by controlling the number of pulses to be supplied to the memory cells as illustrated in the graph of FIG. 23A. As a result of controlling the number of pulses to be supplied to the memory cells, the probability that the values of the memory cells are rewritten can be controlled (controlled linearly) to gradually increase as the number of pulses width is larger (=as the voltage value is larger) as illustrated in the graph of FIG. 23B. The third technique can be easily achieved with a digital circuit and can reduce the area of peripheral circuits.

Note that, when variation in voltage occurs in the first to third techniques, information on pulse voltages, pulse widths, or the numbers of pulses necessary for obtaining those with large probability values or those with small probability values is stored in advance in a form of an association table, for example, in view of the influence of the variation in voltage. The controller 20 then controls the voltage to be supplied to the memory cells by using the association table. As a result, the influence of the variation in voltage can be effectively avoided.

While the probability computation process achieved according to a typical integrated circuit technology is disadvantageous in that the circuit area is large, the probability computation process performed as described above allows processing to be efficiently carried out with a small area. The small area reduces the manufacture cost and shortens the development period of integrated circuits. Furthermore, the small area enables parallel operation of circuit blocks in small units and thus enables parallel operation of multiple processes, which increases the processing speed. When the circuit area per unit process is small, the length of wires connecting unit circuits typically becomes shorter, which can also reduce power consumption of charge and discharge of wires that significantly affects the power consumption of the circuits.

An error correction is performed using methods and devices having these characteristics and being capable of making the probability computation process more efficient. Among error correction processes, an error correction code considered strongest in theory is the LDPC. Details thereof will be described later. The reason for which the LDPC is has a strong correcting capability is that a method or an algorithm using the probability values for estimating the number and the locations of errors through computation of probability values can be used. The strength of correcting capability and the complexity of mounted circuits are typically correlated. In particular, in the case of probability computation, it is known that the area becomes large since multiplication that enlarges the circuit area required for computation is repeated.

In contrast, as repeated above, use of the probability computation unit 400 enables the probability computation to be performed with a small area. As a result, the frequency of error correction processes can be increased or the accuracy of processes can be increased in the memory system, which improves the reliability as compared to the memory system of the related art.

In particular, as a feature of the present invention, since the number of errors (occurrence frequency) in write data can be estimated in the error correction using probability computation, the degree of degradation of a specific memory block can be estimated. Thus, an optimum check matrix can be selected and used accordingly.

It is known that a check matrix has a higher correcting capability as the code length to be processed is longer. For example, when code lengths of 32 bits and 1024 bits are compared, the correcting capability with 1024 bits clearly tends to be higher. As the code length is longer, however, the load (the number of necessary computing units, the number of memories that hold probability values, and control capacity of the controller 20 that controls data processing) on circuits relating to the error correct-on increases. Thus, since the number of errors is relatively small immediately after shipment of memory systems, a memory system as a whole can exhibit higher performance (high-speed input/output of data, for example) by using a check matrix for a shorter code length. The memory system according to the embodiment can perform error correction of the memory 500 and obtain the number of errors involved a significantly larger number of times than the memory system memory system of the related art. The number of occurring errors and the check matrix to be used therefor can also be estimated by using the probability computation unit 400 in the memory system.

Next, when probability values (data) are written into the memory cells in the first memory 100, the probability computation unit 400 performs the error correction on the data written in the memory cells by an error correction technique using the low density parity check code (LDPC), for example. A LDPC code is a code characterized by a low density parity check matrix H in which the density of "1" is low. In other words, a LDPC code is a code characterized by a low density parity check matrix H in which the majority of the elements thereof are "0" and only a few elements are "1." In the following description, the low density parity check matrix H may simply be referred to as a "check matrix H."

In the case of the memory system according to the embodiment, multiple check matrices H that are switched according to the number of occurring errors are stored in the first memory 100, for example. Specifically, the error rate of the memory system gradually increases as the use period is longer. When the error rate becomes a predetermined rate or higher, the memory system can no longer be used and reaches a so-called life limit.

The memory system according to the embodiment is provided with multiple check matrices H according to the numbers of occurring errors in the first memory 100, such as a first check matrix H to be used when the number of errors is smaller than 10, a second check matrix H to be used when the number of errors is smaller than 30, a third check matrix H to be used when the number of errors is smaller than 50, . . . , for example. The probability computation unit 400 performs an error correction on data written into memory cells of the first memory 100 by using the LDPC code described below, for example. In this error correction, the number of errors can be recognized.

The probability computation unit 400 performs the error correction by selectively using a check matrix H according to the recognized number of errors. For example, when the recognized number of errors is 25 while the probability computation unit 400 is currently using the first check matrix H, the probability computation unit 400 stops using the first check matrix H and performs the error correction using the second check matrix H instead. As a result, it is possible to provide a memory system capable of suppressing the occurrence of errors to "0" by meeting the number of errors increasing with the use period and thus capable of being used for a long time (the lifetime of the memory system can be extended).

Next, the size of a check matrix H is larger as the code length is longer. For convenience of explanation, a check matrix H is assumed to be a matrix of 8 rows×4 columns. The number of "1"s contained in each row and each column of the check matrix H is referred to as a weight, and it is assumed that the weights of the respective rows and the respective columns of the check matrix H are larger than 0. A case in which the weights of the respective rows are uniform (constant values) and the weights of the respective columns are also uniform (constant values) is referred to as regular. Herein, the check matrix H is a regular matrix in which the weights of the respective rows are all 4 and the weights of the respective columns are all 2.

In the LDPC code, a data string x to be transmitted to a channel or stored in a memory and processed is converted to a data string c where $Hc^T=0$. This "c" is referred to as a code. That is, data used for information processing are not an original data string x but the code c. Typically, the code c is a data string longer than the data string x. The code c contains information necessary for the error correction in addition to information contained in the data string x. Coding is mapping in which the data string x corresponds one-to-one to the code c. In other words, when a data string x is given, a code c is uniquely determined, while conversely, when a code c is given, the original data string x thereof is uniquely determined. "(Length of data string x)/(length of code c)" is referred to as a coded rate. An error correction method can be deemed to be more efficient as the coded rate is higher.

Figure 24:
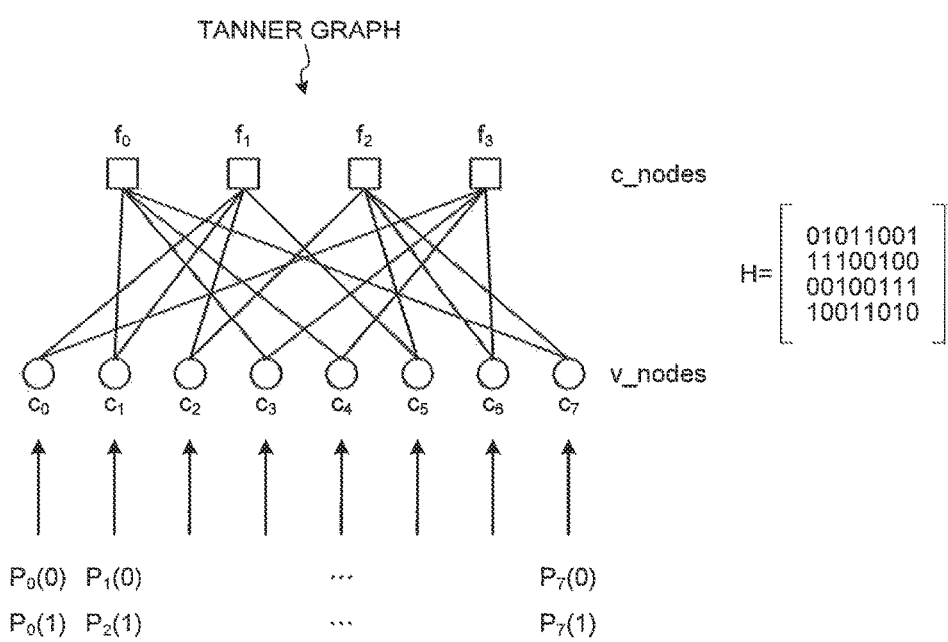
FIG. 24 is a diagram illustrating the Tanner graph representing a check matrix in the memory system according to the embodiment.

The check matrix H can be expressed by a Tanner graph representing connecting states between a plurality of check nodes associated one-to-one with a plurality of rows and a plurality of variable nodes associated one-to-one with a plurality of columns. An example of 8 bits will be described but long data strings such as 1000 bits are handled in practice. FIG. 24 is a diagram illustrating an example of the Tanner graph representing the check matrix H. In the Tanner graph, multiple check nodes $f_0$ to $f_3$ corresponding one-to-one to multiple rows (four rows in the example of FIG. 24) of the check matrix H are arranged in the upper part thereof. Furthermore, in the Tanner graph, multiple variable nodes $c_0$ to $c_7$ corresponding one-to-one to multiple columns (eight columns in the example of FIG. 24) of the check matrix H are arranged in the lower part thereof. Furthermore, in the Tanner graph, a check node $f_j$ and a variable node $c_i$ corresponding to a combination of a row and a column where the element of the check matrix H is "1" are connected.

For example, in the example of FIG. 24, a check node $f_0$ corresponding to the zeroth row and a variable node $c_1$ corresponding to the first column are connected. This means that the element on the zeroth row and the first column of the check matrix H is "1." In this manner, the check matrix H can be expressed by a Tanner graph representing connecting states between check nodes $f_j$ and variable nodes $c_i$.

Next, procedures of a basic error correction using the LDPC code performed by the probability computation unit 400 will be described with reference to a flowchart of FIG. 25. Herein, a case of the belief propagation method (BP method) will be described. In addition, an error correction in a soft decision scheme will be described. Soft decision is the antonym of hard decision for digitally making determination as "0" or "1" by using one threshold. Soft decision is for determining a probability of being 0 (likelihood of being "0") or a probability of being 1 (likelihood of being "1") in an analog manner instead of making complete determination of 0 or 1.

Herein, a set of data (digital data) resulting from coding using the check matrix H is stored in a memory (such as a DRAM, an MRAM, an NAND flash memory or an ReRAM) or a channel that is not illustrated, and a string {yi} that is a physical quantity (a value of read voltage, for example) for reading a coded data string from the memory is input to each variable node {ci, ck, . . . } (step S51).

The variable node ci calculates a probability P1 that the value of digital data stored in the memory is 1 (from a different perspective, a probability that the value of digital data associated with the variable node ci is 1) from the received physical quantity yi (step S52). The variable node ci transmits the calculated probability P1 as a first message {qij, qkj, . . . } to each of the check nodes {fj, fk, . . . } connected thereto (step S53). Note that a first message qij(0) is calculated by the following expression (1) and a first message qij(1) is calculated by the following expression (2).

$$q_{ij}(0) = K_{ij}(1 - P_i) \prod_{j' \in C_i \setminus j} r_{j'i}(0) \quad (1)$$

$$q_{ij}(1) = K_{ij} P_i \prod_{j' \in C_i \setminus j} r_{j'i}(1) \quad (2)$$

Subsequently, the probability computation unit 400 resets the number of computations to 0 (n=0) (step S54). As illustrated in FIG. 26A, the check node fj calculates a second message {rji, rki, . . . } representing a probability that the value of digital data associated with a variable node is 1 for each of the variable nodes {ci, ck, . . . } connected thereto so that a parity condition is satisfied on the basis of the first messages {qij, qkj, . . . } received from the respective variable nodes {ci, ck, . . . } connected thereto, and returns the second message to the variable node (step S55). Note that a second message rji(0) is calculated by the following expression (3) and a second message rji(1) is calculated by the following expression (4)

$$r_{ji}(0) = \frac{1}{2} + \frac{1}{2} \prod_{i' \in V_j \setminus i} (1 - 2q_{i'j}(1)) \quad (3)$$

$$r_{ji}(1) = 1 - r_{ji}(0) \quad (4)$$

Note that the check node fj does not take the first message qij transmitted from the variable node ci into account in calculation of the second message rji to be returned to the variable node ci, for example. In other words, the variable node ci will receive a second message rji that is calculated on the basis of the first messages {qkj, clj, . . . } from the variable nodes {ck, cl, . . . } connected to the check node fj other than the variable node ci.

The variable node ci calculates a probability Qi that the value of digital data associated with the received physical quantity yi is 1 by using the second messages {rji, rki, . . . } received from the respective check nodes {fj, fk, . . . } connected thereto and the probability P1 (the first message q) thereof (step S56). Note that a probability Qi(0) is calculated by the following expression (5) and a probability Qi(1) is calculated by the following expression (6).

$$Q_i(0) = K_i(1 - P_i) \prod_{j \in C_i} r_{ji}(0) \quad (5)$$

$$Q_i(1) = K_i P_i \prod_{j \in C_i} r_{ji}(1) \quad (6)$$

Next, in one example, it is assumed that the value of the digital data associated with the received physical quantity yi is 1 when Qi is ½ or higher, while it is assumed that the value of the digital data associated with the received physical quantity yi is 0 when Qi is lower than ½ (step S57). The probability computation unit 400 then performs parity check by using the value (assumed value) assumed in step S57 (step S58).

More specifically, the probability computation unit 400 determines whether $H_{ctemp}^T=0$ is satisfied for a string of assumed values $c_{temp} = \{c_{0temp}, c_{1temp}, \ldots\}$ (step S59). If $H_{ctemp}^T=0$ is satisfied (step S59: Yes), it is concluded that the string of assumed values $c_{temp}$ is the digital data string stored in the memory (step S60). The error correction of FIG. 24 is thus terminated. Since, however, this conclusion is an estimation result, there is possibility that the conversion has resulted in erroneous data. This is why the LDPC is classified as "estimation-based".

If $H_{ctemp}^T=0$ is not satisfied (step S59: No), on the other hand, the variable node ci recalculates the first message (step S61) and increments the value of n of the number of computations by 1 (step S62). The process then returns to step S55, where the variable node ci transmits the recalculated first message to the check nodes {fj, fk, . . . } connected thereto. In this case, the first message qij to be transmitted from the variable node ci to the check node fj, for example, is calculated from the probability P1 and the second messages {rki, rli, . . . } received from the check nodes {fk, fl, . . . } connected to the variable node ci other than the check node fj as illustrated in FIG. 26B. Thus, the second message rji received from the check node fj is not taken into account in the calculation of the first message qij. In other words, the check node fj will receive the first message qij calculated on the basis of the second messages {rki, rli, . . . } from the check nodes {fk, fl, . . . } connected to the variable node ci other than the check node fj.

The check node fj calculates a second message {rji, rki, . . . } representing a probability that the data associated with a variable node is 1 for each of the variable nodes {ci, ck, . . . } connected thereto so that a parity condition is satisfied on the basis of the first messages {qij, qkj, . . . } received from the respective variable nodes {ci, ck, . . . } connected thereto, and returns the second message {rji, rki, . . . } to the variable node. The above-described algorithm is repeated until the parity condition is satisfied. The error correction in the LDPC is performed by repeating the calculations.

The variable node ci estimates a true value $c_i^1$ of the digital data associated with the variable node ci (the value of digital data to be received by the variable node ci) by using the second messages {rji, rki, . . . } received from the respective check nodes (fj, fk, . . . ) connected thereto and the probability P1 (first message q) thereof.

More specifically, the variable node ci estimates the true value $c_i^1$ of the digital data associated with the variable node ci by majority decision of values of digital data represented by the second messages {rji, rki, . . . } received from the respective check nodes {fj, fk, . . . } connected thereto and the probability P1 thereof (first message q). As illustrated in FIG. 27, $c_i^1$ is then estimated to be "0" if the number of "0"s is larger, while $c_i^1$ is estimated to be "1" if the number of "1"s is larger.

The probability computation unit 400 performs the parity check by using a string of estimated values $c^1 = \{c_i^1, C_k^1, \ldots\}$ obtained for each variable node {ci, ck, . . . } as described above. Herein, the parity check is likelihood calculation in the sense of checking probable values. Since the likelihood is expressed by parity in hard decision, these are substantially synonymous. This parity check will, however, be referred to as likelihood calculation herein so as to be distinguished from parity check for checking using a check matrix on all data.

More specifically, it is determined whether or not the string $c^1$ of estimated values satisfy $Hc^{1T}=0$. If $Hc^{1T}=0$ is satisfied, it is determined that the data string read out from the memory (the string of coded data) is the string $c^i$ of estimated value, and the calculation is terminated. If $Hc^{1T}=0$ is not satisfied, on the other hand, the variable node ci transmits $c_i^1$ representing the estimation result described above as the first message to each of the check nodes {fj, fk, . . . } connected thereto. The check node fj calculates the second message {rji, rki . . . } for each of the variable nodes {ci, ck, . . . } connected thereto so that the parity condition is satisfied on the basis of the first messages {qij, qkj, . . . } received from the respective variable nodes {ci, ck, . . . } connected thereto, and returns the second message {rji, rki, . . . } to the variable node. The above-described algorithm is repeated until the parity condition is satisfied.

As a result of the parity check, the presence or absence of errors can be determined, and the memory system can autonomously manage its reliability. Specifically, after performing the error correction using probability computation in step S71 of a flowchart of FIG. 28, the probability computation unit 400 transmits a parity check to the controller 20 in step S72. In step S73, the probability computation unit 400 converts the presence or absence of error occurrence into a probability value and saves the probability value in the first memory 100 (memory 500).

In step S74, the controller 20 determines whether or not a check matrix that is stronger than the current matrix is required on the basis of the probability value stored in the first memory 100. If the current check matrix can be used (step S74: No), the process of the flowchart of FIG. 28 is terminated without any change. In contrast, if a check matrix stronger than the current matrix is required (step S74: Yes), the process proceeds to step S75. In step S75, the controller 20 reads a check matrix from the first memory 100 and changes the process so that the first memory 100 including the probability computation unit 400 can perform the error correction, and terminates the process of the flowchart of FIG. 28.

As described above, in the memory system according to the embodiment, the parity check allows the presence or absence of errors to be determined, and the memory system can autonomously manage its reliability. In particular, the presence or absence of errors obtained through the parity check can be statistically stored as a probability value in the first memory 100. Thus, in the memory system according to the embodiment, the check matrices can be switched easily.

Furthermore, data of most of the memory cells in the first memory 100 can be made to be correct data as a result of performing such an error correction using the LDPC code by the probability computation unit 400, errors may remain in some memory cells. In other words, in the memory system according to the embodiment, the probability computation unit 400 performs the error correction using the LDPC code to apply a rough error correction to the data in the first memory 100. The controller 20 then performs an error correction using the BCH code on the data in the first memory 100. As a result, the errors of the data in the first memory 100 can be reduced to "0."

The controller 20 can perform sequential computation at a relatively high speed, but it may take a long time to perform computation of parallel operations as in the error correction using the LDPC code. In the memory system according to the embodiment, however, the error correction using the LDPC code that is a so-called internal code is performed by the probability computation unit 400 and the error correction using the BCH code that is a so-called external code is performed by the controller 20. In other words, the probability computation unit 400 performs the error correction using the LDPC code to roughly complete error correction, and the controller 20 then performs the error correction using the ECH code on data whose errors have roughly been corrected to reduce the errors to "0." As a result, the disadvantage of delay in operation of the controller 20 due to the error correction using the LDPC code can be prevented.

As can be seen from the description above, in the memory system according to the embodiment, the controller 20 writes a voltage (threshold=probability value) at which the probability that data are rewritten is a desired probability into each of the memory cells of the first memory 100 or the like. The probability computation unit 400 provided in the memory performs logic operation such as AND and OR on the data written into the memory cells and writes the logic operation result into other memory cells.

The memory has stored therein multiple check matrices for error correction processes using the LDPC codes. The check matrices are check matrices to be used according to the number of errors of the data written into the memory cells. The probability computation unit 400 performs the error correction using the LDPC code and using a check matrix on the data written in the memory to apply rough error correction thereto. As a result, a rough error correction can be performed on the memory cells and the number of occurring errors can be recognized. The probability computation unit 400 performs the error correction using the LDPC code by selectively using a check matrix according to the recognized number of errors.

As a result, it is possible to perform the error correction by using a check matrix that is switched to meet the number of errors increasing with the use period of the memory. It is therefore possible to provide a memory system capable of being used for a long time (the lifetime of the memory system can be extended).

Furthermore, in the memory system according to the embodiment, the probability computation unit 400 performs the error correction using the LDPC code to roughly complete error correction, and the controller 20 then performs the error correction using the BCH code on data whose errors have roughly been corrected to reduce the errors to "0." The controller 20 can perform sequential computation at a relatively high speed, but it may take a long time to perform computation of parallel operations as in the error correction using the LDPC code. In the memory system according to the embodiment, however, since the probability computation unit 400 performs the error correction using the LDPC code, the disadvantage of delay in operation of the controller 20 due to the error correction using the LDPC code can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a memory that stores therein multiple check matrices in advance, each of the multiple check matrices being associated with a number of errors in data to be written into the memory; and
    computing circuitry configured to perform, when data is written into the memory, a first error correction on the written data to recognize a number of errors in the written data, and to selectively use, from among the multiple check matrices, a check matrix associated with the recognized number of errors.

2. The system according to claim 1, wherein the computing circuitry is further configured to:
    perform the first error correction by performing operation of probability values,
    recognize the number of errors in the data written in the memory, and
    select the check matrix associated with the recognized number of errors from among the multiple check matrices.

3. The system according to claim 2,
    wherein the probability values are written into the memory, each of the probability values being controlled so that a probability with which each of the probability values is rewritten will be a desired probability by adjusting a write voltage, and
    wherein the computing circuitry is further configured to:
        perform logic operation of the probability values written in the memory,
        write a result of the logic operation into the memory, and
        perform the first error correction on the probability values written in the memory.

4. The system according to claim 1, further comprising a controller configured to:
    write the data into the memory, and
    perform, for reducing the errors to zero, a second error correction on the data on which the first error correction is performed by the computing circuitry, the second error correction being an error correction other than the first error correction.

5. The system according to claim 1, wherein
    the memory is physically divided into a first memory and a second memory, and the computing circuitry is provided in either one of the first memory and the second memory.

6. The system according to claim 1, wherein the memory is physically divided into a first memory and a second memory, and
the computing circuitry is physically divided into a first computing circuitry and a second computing circuitry, the first computing circuitry being provided in the first memory, the second computing circuitry being provided in the second memory.

7. The system according to claim 1, wherein the computing circuitry is provided in the memory.

8. An error correction device comprising:
a memory that stores therein multiple check matrices in advance, each of the multiple check matrices being associated with a number of errors in data to be written into the memory; and
computing circuitry provided in the memory and configured to perform, when data is written into the memory, a first error correction on the written data to recognize a number of errors in the written data, and to selectively use, from among the multiple check matrices, a check matrix associated with the recognized number of errors.

9. An error correction method comprising:
writing data into a memory by a controller, the memory storing therein multiple check matrices in advance, each of the multiple check matrices being associated with a number of errors in data to be written into the memory; and
performing, by a computing circuitry provided in the memory, when data is written into the memory, a first error correction on the written data to recognize a number of errors in the written data and to selectively use, from among the multiple check matrices, a check matrix associated with the recognized number of errors.

* * * * *